US012604680B2

(12) United States Patent (10) Patent No.: US 12,604,680 B2

Matsumoto et al. (45) Date of Patent: Apr. 14, 2026

(54) METHOD FOR MANUFACTURING GROUP III NITRIDE SEMICONDUCTOR SUBSTRATE

(71) Applicant: SUMCO CORPORATION, Tokyo (JP)

(72) Inventors: Koji Matsumoto, Tokyo (JP); Toshiaki Ono, Tokyo (JP); Hiroshi Amano, Aichi (JP); Yoshio Honda, Aichi (JP)

(73) Assignee: SUMCO CORPORATION, Tokyo (JP)

( * ) Notice: Subject to any disclaimer, the term of this patent is extended or adjusted under 35 U.S.C. 154(b) by 82 days.

(21) Appl. No.: 18/494,122

(22) Filed: Oct. 25, 2023

(65) Prior Publication Data

US 2024/0071756 A1 Feb. 29, 2024

Related U.S. Application Data

(62) Division of application No. 16/770,883, filed as application No. PCT/JP2018/036851 on Oct. 2, 2018, now abandoned.

(30) Foreign Application Priority Data

Dec. 19, 2017 (JP) ................................. 2017-243117

(51) Int. Cl.
H01L 21/02 (2006.01)
H10P 14/20 (2026.01)
(Continued)

(52) U.S. Cl.
CPC .......... H10P 14/2905 (2026.01); H10P 14/24 (2026.01); H10P 14/2926 (2026.01);
(Continued)

(58) Field of Classification Search
CPC .. H10P 14/2905; H10P 14/24; H10P 14/2926; H10P 14/3216; H10P 14/3248;
(Continued)

(56) References Cited

U.S. PATENT DOCUMENTS 6,064,078 A * 5/2000 Northrup .......... H01L 21/02458
257/190
7,312,480 B2 12/2007 Hata
(Continued)

FOREIGN PATENT DOCUMENTS

EP 1829111 A2 6/2006
JP 2003-086837 A 3/2003
(Continued)

OTHER PUBLICATIONS

Ganguly et al., "Plasma MBE growth conditions of AlGaN/GaN high-electron-mobility transistors on silicon and their device characteristics with epitaxially regrown ohmic contacts," Applied Physics Express 7 (2014) 105501.*
(Continued)

*Primary Examiner* — Jay C Kim

(74) *Attorney, Agent, or Firm* — GREENBLUM & BERNSTEIN, P.L.C.

(57) ABSTRACT

A method for manufacturing a group III nitride semiconductor substrate, that includes: growing a first AlN buffer layer on an Si substrate at a first growth temperature; growing a second AlN buffer layer on the first AlN buffer layer at a second growth temperature higher than the first growth temperature; and growing a group III nitride semiconductor layer on the second AlN buffer layer, wherein an Al raw material and an N raw material are alternately repeatedly fed in the growing the first AlN buffer layer.

22 Claims, 14 Drawing Sheets

(51) Int. Cl.
   *H10P 14/24* (2026.01)
   *H10P 36/00* (2026.01)
(52) U.S. Cl.
   CPC ...... *H10P 14/3216* (2026.01); *H10P 14/3248* (2026.01); *H10P 14/3251* (2026.01); *H10P 14/3416* (2026.01); *H10P 36/03* (2026.01); *H10P 14/38* (2026.01)
(58) Field of Classification Search
   CPC .. H10P 14/3251; H10P 14/3416; H10P 36/03; H10P 14/38; C23C 16/0281; C23C 16/303; C23C 16/46; C23C 16/52; C23C 16/34; C30B 25/183; C30B 29/403; C30B 25/16; C30B 29/38; H01L 21/02381; H01L 21/02458; H01L 21/02505; H01L 21/0254; H01L 21/3221; H01L 21/02664
   See application file for complete search history.

(56) References Cited

U.S. PATENT DOCUMENTS

| | | | |
|---|---|---|---|
| 7,598,108 | B2 | 10/2009 | Li |
| 7,811,847 | B2 * | 10/2010 | Hirayama ......... H01L 21/02458 |
| | | | 438/46 |
| 7,956,370 | B2 | 6/2011 | Pan |
| 8,173,464 | B2 | 5/2012 | Yokoyama |
| 8,212,288 | B2 * | 7/2012 | Komiyama ......... H01L 21/0254 |
| | | | 257/190 |
| 8,679,881 | B1 | 3/2014 | Chyi et al. |
| 8,686,455 | B2 | 4/2014 | Ichizono |
| 8,778,783 | B2 | 7/2014 | Melnik |
| 8,828,768 | B2 | 9/2014 | Stauss |
| 8,980,002 | B2 | 3/2015 | Melnik |
| 9,184,337 | B2 | 11/2015 | Stauss |
| 9,214,339 | B2 | 12/2015 | Okuno |
| 9,337,381 | B2 | 5/2016 | Kim |
| 9,673,052 | B2 | 6/2017 | Shikauchi |
| 10,121,656 | B2 | 11/2018 | Chen |
| 10,158,046 | B2 | 12/2018 | Xu |
| 2003/0106482 | A1 | 6/2003 | Kononchuk et al. |
| 2007/0197004 | A1 | 8/2007 | Dadgar |
| 2008/0308835 | A1 | 12/2008 | Pan |
| 2009/0008647 | A1 | 1/2009 | Li |
| 2009/0057646 | A1 | 3/2009 | Hirayama et al. |
| 2009/0191695 | A1 | 7/2009 | Park et al. |
| 2010/0133506 | A1 * | 6/2010 | Nakanishi ............... H01L 33/32 |
| | | | 257/14 |

| | | | |
|---|---|---|---|
| 2010/0279020 | A1 | 11/2010 | Melnik |
| 2012/0003821 | A1 | 1/2012 | Yui et al. |
| 2013/0319333 | A1 * | 12/2013 | Lee ......................... B05B 1/005 |
| | | | 239/548 |
| 2015/0053996 | A1 | 2/2015 | Narita et al. |
| 2015/0171173 | A1 | 6/2015 | Umeda et al. |
| 2016/0233293 | A1 | 8/2016 | Thapa et al. |
| 2016/0351666 | A1 | 12/2016 | Deliwala et al. |
| 2017/0069713 | A1 | 3/2017 | Roberts et al. |
| 2017/0117136 | A1 | 4/2017 | Kobayashi |
| 2017/0213718 | A1 | 7/2017 | Sundaram et al. |

FOREIGN PATENT DOCUMENTS

| | | | |
|---|---|---|---|
| JP | 2005-072409 | A | 3/2005 |
| JP | 2012-15305 | A | 1/2012 |
| JP | 2012-49465 | A | 3/2012 |
| JP | 2013-069983 | A | 4/2013 |
| JP | 2016-154221 | A | 8/2016 |
| JP | 2016-533643 | A | 10/2016 |
| JP | 2016-533645 | A | 10/2016 |
| WO | WO 2013/145404 | A1 | 10/2013 |
| WO | WO 2014/041736 | A1 | 3/2014 |
| WO | WO 2016/132746 | A1 | 8/2016 |

OTHER PUBLICATIONS

ISR for PCT/JP2018/036851 dated Nov. 20, 2018.
Supplementary Partial ESR for EP App. No. 18892096.1, dated Jul. 23, 2021.
Radhakrishnan et al., "Demonstration of AlGaN/GaN high-electron-mobility transistors on 100 mm diameter Si(111) by plasma-assisted molecular beam epitaxy", Applied Physics Letters, 97:232107-1-232107-3 (2010).
Supplementary ESR for EP App. No. 18892096.1, dated Nov. 19, 2021.
Pattison et al., "Improving GaN on Si Power Amplifiers through reduction of parasitic conduction layer", 9$^{th}$ European Microwave Integrated Circuit Conference, pp. 92-95 (2014).
Le Louarn et al., "AlN buffer layer growth for GaN epitaxy on (111) Si: Al or N first?", Journal of Crystal Growth, 311(12):3278-3284 (2009).
Yu et al., "A study of semi-insulating GaN grown on AlN buffer/sapphire substrate by metalorganic chemical vapor deposition," Journal of Crystal Growth 293 (2006) pp. 273-277.

* cited by examiner

| | Condition | Crystallinity | Ga conc. | Al conc. | Carrier conc. |
|---|---|---|---|---|---|
| Ex. 1 | AlN low-temp (550°C)/simul feeding → high-temp/simul feeding GaN high-temp/simul feeding | 1.2 | 0.05 | 0.04 | 0.05 |
| Ex. 2 | AlN low-temp (550°C)/simul feeding → high-temp/simul feeding GaN high-temp/simul feeding | 1.1 | 0.05 | 0.04 | 0.05 |
| Ex. 3 | AlN low-temp (550°C)/simul feeding → high-temp/alt feeding GaN high-temp/simul feeding | 1 | 0.05 | 0.02 | 0.04 |
| Ex. 4 | AlN low-temp (650°C)/simul feeding → high-temp/simul feeding GaN low-temp/simul feeding → high-temp/simul feeding | 1 | 0.02 | 0.04 | 0.02 |
| Ex. 5 | AlN low-temp (650°C)/simul feeding → high-temp/simul feeding AlGaN low-temp/simul feeding → high-temp/simul feeding | 1 | 0.01 | 0.04 | 0.02 |
| Ex. 6 | AlN low-temp (650°C)/simul feeding → high-temp/simul feeding GaN low-temp/alt feeding → high-temp/simul feeding | 1 | 0.01 | 0.04 | 0.02 |
| Ex. 7 | AlN low-temp (650°C)/alt feeding → high-temp/alt feeding GaN low-temp/alt feeding → high-temp/simul feeding | 1 | 0.01 | 0.02 | 0.02 |
| Ex. 8 | C-doped substrate | 1 | 1 | 1 | 0.01 |
| Ex. 9 | Ge-doped substrate | 1 | 1 | 1 | 0.01 |
| Ex. 10 | Sn-doped substrate | 1 | 1 | 1 | 0.01 |
| Ex. 11 | O-doped substrate | 1 | 1 | 1 | 0.01 |
| Ex. 12 | C-doped epitaxially grown | 1 | 1 | 1 | 0.01 |
| Ex. 13 | Ge-doped epitaxially grown | 1 | 1 | 1 | 0.01 |
| Ex. 14 | Sn-doped epitaxially grown | 1 | 1 | 1 | 0.01 |
| Ex. 15 | O-doped epitaxially grown | 1 | 1 | 1 | 0.01 |
| Ex. 16 | P-doped epitaxially grown | 1 | 1 | 1 | 0.01 |
| Ex. 17 | Gradually reduced P-doped epitaxially grown | 1 | 1 | 1 | 0.01 |
| Ex. 18 | H-ion-implanted substrate | 1 | 1 | 1 | 0.01 |
| Ex. 19 | First AlN layer is doped with P | 1 | 1 | 1 | 0.01 |
| Ex. 20 | Apply heat treatment at 1100°C for 30 min after formation of AlN layer | 1 | 0.05 | 0.04 | 0.05 |
| Compar. Ex. 1 | AlN low-temp (650°C)/simul feeding → high-temp (1100°C)/simul feeding GaN high-temp/simul feeding | 1 | 1 | 1 | 1 |
| Compar. Ex. 2 | AlN low-temp (350°C)/simul feeding → high-temp (1100°C)/simul feeding GaN high-temp/simul feeding | 100 | 0.01 | 0.02 | 0.02 |
| Compar. Ex. 3 | AlN low-temp (550°C)/simul feeding → high-temp (800°C)/simul feeding GaN high-temp/simul feeding | 30 | 1 | 0.03 | 0.78 |

FIG.13

| | Condition | Surface roughness 30 um × 30 um | Surface roughness 10 um × 10 um |
|---|---|---|---|
| Ex. 21 | 0.2° toward <112> direction | 0.9 | 0.4 |
| Ex. 22 | 1.5° toward <112> direction | 1.2 | 0.6 |
| Compar. Ex. 4 | 0° | 1.7 | 0.4 |
| Compar. Ex. 5 | 2° toward <112> direction | 3.5 | 2.4 |
| Compar. Ex. 6 | 0.2° toward direction of 45° from <112> direction | 1.6 | 1.0 |
| Compar. Ex. 7 | 0.2° toward <110> direction | 1.7 | 1.0 |

FIG. 14

METHOD FOR MANUFACTURING GROUP III NITRIDE SEMICONDUCTOR SUBSTRATE

CROSS-REFERENCE TO RELATED APPLICATIONS

This is a Divisional of U.S. application Ser. No. 16/770,883, which is a U.S. National Stage entry of PCT/JP2018/036851, filed Oct. 2, 2018, which claims priority to JP Application No. 2017-243117, filed Dec. 19, 2017. The disclosure of each of the applications identified above is herein incorporated by reference in its entirety.

TECHNICAL FIELD

The present invention relates to a method for manufacturing a group III nitride semiconductor substrate and, more particularly, to a method for growing a group III nitride semiconductor layer on an Si substrate through an AlN buffer layer.

BACKGROUND ART

A group III nitride semiconductor typified by GaN is larger in bandgap, higher in dielectric breakdown field strength, and higher in saturated electron mobility than other semiconductors, so that it is suitably used as a material of optical devices such as an LED (Light Emitting Diode) and an LD (Laser Diode) or power semiconductor devices.

With the current manufacturing technology, it is difficult to manufacture a bulk single crystal of the group III nitride semiconductor at low cost, so that there has been generally adopted a method of hetero-epitaxially growing a group III nitride semiconductor on a single crystal substrate such as a sapphire substrate, a silicon carbide (SiC) substrate, or a silicon (Si) substrate. Recently, attempts have been made to mass produce the group III nitride semiconductor using an Si substrate on which a large-diameter, high-quality bulk single crystal can be produced.

When a group III nitride semiconductor is epitaxially grown on a substrate of a different type, many dislocations are typically generated in a group III nitride semiconductor layer due to lattice mismatch between a substrate material and a group III nitride semiconductor material. For example, a dislocation density on the surface of a GaN layer formed on a sapphire substrate is about $5 \times 10^8/cm^2$, and a dislocation density on the surface of the GaN layer formed on an Si substrate is about $1 \times 10^9/cm^2$ to $1 \times 10^{10}/cm^2$. Such a dislocation in the group III nitride semiconductor layer may cause a deterioration in light emission efficiency in an LED and may cause a current leak in a power semiconductor device.

In order to reduce the dislocation density of the group III nitride semiconductor layer, the group III nitride semiconductor layer is formed on a substrate through a buffer layer. For example, Patent Document 1 states that an AlN buffer layer is grown at a low temperature of 950° C. after thermal cleaning and nitriding treatment, and then the AlN buffer layer is further grown at a high temperature of 1230° C., followed by growth of a group III nitride semiconductor layer.

Further, Patent Document 2 states that an AlN buffer layer is grown at a low temperature of 600° C. to 900° C. after baking of a substrate surface at 1050° C., and then the AlN buffer layer is further grown at a high temperature exceeding 900° C., followed by growth of a group III nitride semiconductor layer. Furthermore, Patent Document 3 states that, in order to improve crystallinity of a nitride semiconductor film to be grown on an Si substrate, a silicon substrate having its main surface inclined at an off-angle in the range of 0.1° or more to 1.6° or less in an arbitrary direction from a {111} plane having a cubic crystal structure is used.

CITATION LIST

Patent Document

[Patent Document 1] Japanese Patent Application Laid-Open No. 2005-072409

[Patent Document 2] Japanese Patent Application Laid-Open No. 2013-069983

[Patent Document 3] Japanese Patent Application Laid-Open No. 2003-086837

SUMMARY OF THE INVENTION

Problem to be Solved by the Invention

In order to improve crystallinity of the AlN buffer layer, it is preferable to grow AlN at a high temperature of 900° C. or more; however, when AlN is grown at such a high temperature, an Al raw material or a group III raw material such as Ga or In remaining in a furnace may diffuse into an Si substrate to disadvantageously reduce the resistivity of the surface of the Si substrate. The reduction in the resistivity of the surface of the Si substrate may cause a current leak path or increase a parasitic capacitance.

In the method described in Patent Document 1, since AlN is grown first at a temperature of 900° C. or more, group III elements diffuse into the Si substrate to reduce the resistivity of the surface of the Si substrate. Further, in the method of Patent Document 1, on the assumption that a sapphire substrate or an SiC substrate is used, substrate nitriding treatment is performed with an $NH_3$ gas fed at a high temperature before formation of AlN buffer layer; however, if the same nitriding treatment is applied to the Si substrate, the surface of the Si substrate reacts with nitride to be roughened, thus failing to grow AlN having satisfactory crystallinity. Further, in the method described in Patent Document 2, AlN is grown first at a temperature of 600° C. to 900° C.; in this case, an effect of suppressing the diffusion of the group III elements into the Si substrate is small, and thus further improvement is required.

The present invention has been made in view of the above situation, and the object thereof is to provide a method for manufacturing a group III nitride semiconductor substrate, capable of suppressing a reduction in resistivity of the surface of an Si substrate due to the diffusion of group III elements into the Si substrate when a group III nitride semiconductor layer is grown on the Si substrate through an AlN buffer layer.

Means for Solving the Problem

To solve the above problems, a method for manufacturing a group III nitride semiconductor substrate according to a first aspect of the present invention includes steps of: growing a first AlN buffer layer on an Si substrate; growing a second AlN buffer layer on the first AlN buffer layer at a temperature higher than a growth temperature of the first AlN buffer layer; and growing a group III nitride semiconductor layer on the second AlN buffer layer, wherein the growth temperature of the first AlN buffer layer is 400° C. to 600° C.

When, in a process of growing the group III nitride semiconductor layer on the Si substrate through the AlN buffer layer, the AlN buffer layer is grown at a high temperature from the initial stage of growth thereof so as to improve crystallinity, group III elements such as Ga or In remaining in a furnace may react with the Si substrate to diffuse into the Si substrate, reducing the resistivity of the surface of the Si substrate. On the other hand, in the manufacturing method according to the present invention, the AlN buffer layer is grown first at a low temperature of 400° C. to 600° C., followed by growth of the group III nitride semiconductor layer, so that it is possible to suppress the group III elements from reacting with the Si substrate, which in turn can prevent the resistivity of the surface of the Si substrate from decreasing.

In the present invention, a growth temperature of the second AlN buffer layer is preferably 900° C. to 1200° C. This allows improvement in the crystallinity of the AlN buffer layer while suppressing diffusion of the group III raw material into the Si substrate.

In the present invention, the thickness of the first AlN buffer layer is preferably 0.4 nm to 100 nm, and a total thickness of the first and second AlN buffer layers is preferably 30 nm to 200 nm. This allows formation of an AlN buffer layer with less occurrence of cracks and with improved crystallinity.

In the present invention, the step of growing the group III nitride semiconductor layer includes steps of: growing a first group III nitride semiconductor layer on the second AlN buffer layer; and growing a second group III nitride semiconductor layer on the first group III nitride semiconductor layer at a temperature higher than a growth temperature of the first group III nitride semiconductor layer, wherein the growth temperature of the first group III nitride semiconductor layer is preferably 400° C. to 800° C., and the growth temperature of the first AlN buffer layer is preferably lower than the growth temperature of the first group III nitride semiconductor layer.

Upon the growth of the group III nitride semiconductor layer on the AlN buffer layer, the group III nitride semiconductor layer is grown at a low temperature in the initial stage up to a thickness of 200 nm, so that it is possible to prevent the group III elements from diffusing into the Si substrate through the AlN buffer layer. Further, the group III nitride semiconductor layer is grown at a high temperature after the thickness reaches 200 nm, so that it is possible to improve the crystallinity of the group III nitride semiconductor layer.

In the present invention, a resistivity of the Si substrate is preferably 100 Ωcm or more, the Si substrate preferably contains an impurity element selected from C, Ge, Sn, O, H, and a group V element, and the concentration of the impurity element contained at least in a surface layer part of the Si substrate ranging from the surface to the depth of 0.5 um to 10 um is preferably $1\times10^{12}$ atoms/cm$^3$ to $1\times10^{20}$ atoms/cm$^3$. This allows suppression of an increase in the number of carriers caused due to the diffusion of the group III elements into the Si substrate during formation of the AlN buffer layer.

The method for manufacturing a group III nitride semiconductor substrate according to the present invention preferably further includes, before growing the group III nitride semiconductor layer, a step of applying heat treatment at 900° C. to 1450° C. to the Si substrate on which the first AlN buffer layer and second AlN buffer layer have been sequentially grown. This allows the group III elements that have diffused into the Si substrate during formation of the AlN buffer layer to diffuse more deeply into the substrate interior from the surface thereof to make it possible to increase the resistivity of the Si substrate around the boundary with the AlN buffer layer.

In the present invention, the Si substrate preferably has a main surface inclined toward a <112> direction by 0.1° to 1.5° from the (111) plane of a silicon single crystal. This allows improvement in the surface roughness of the upper surface of the group III nitride semiconductor layer.

A method for manufacturing a group III nitride semiconductor substrate according to a second aspect of the present invention includes the steps of: growing a first AlN buffer layer on an Si substrate at a first growth temperature; growing a second AlN buffer layer on the first AlN buffer layer at a second growth temperature higher than the first growth temperature; and growing a group III nitride semiconductor layer on the second AlN buffer layer, wherein an Al raw material and an N raw material are alternately repeatedly fed in the step of growing the first AlN buffer layer.

According to the present invention, the AlN buffer layer is grown at a low temperature, so that it is possible to suppress diffusion of the group III elements such as Ga into the Si substrate, which in turn can prevent the resistivity of the surface of the Si substrate from decreasing. Further, the Al raw material and the N raw material are fed not simultaneously but alternately, so that it is possible to prevent degradation in the crystallinity of AlN due to low-temperature growth.

In the present invention, the first growth temperature is preferably 400° C. to 800° C. and, more preferably, 400° C. to 600° C. The second growth temperature is preferably 900° C. to 1200° C. This allows suppression of diffusion of the group III elements into the Si substrate.

In the present invention, the Al raw material is preferably introduced prior to the introduction of the N raw material in the step of growing the first AlN buffer layer. This can prevent the surface of the Si substrate from being nitrided, allowing growth of the first AlN buffer layer with improved crystallinity.

In the present invention, the thickness of the first AlN buffer layer is preferably 0.4 nm to 100 nm, and a total thickness of the first and second AlN buffer layers is preferably 30 nm to 200 nm. This allows formation of an AlN buffer layer with less occurrence of cracks and with improved crystallinity.

In the present invention, the Al raw material and the N raw material are each preferably fed for 0.5 seconds to 10 seconds in the step of growing the first AlN buffer layer. This allows formation of a high-quality AlN buffer layer without degrading productivity.

In the step of growing the second AlN buffer layer, the Al raw material and the N raw material are preferably alternately repeatedly fed. By feeding the Al raw material and the N raw material not simultaneously but alternately, the crystallinity of the second AlN buffer layer can be further improved.

The method for manufacturing a group III nitride semiconductor substrate according to the present invention preferably further includes a step of applying heat treatment at 900° C. to 1450° C. to the Si substrate on which the first AlN buffer layer and second AlN buffer layer have been sequentially grown before growing the group III nitride semiconductor layer. This allows the group III elements that have diffused into the Si substrate during formation of the AlN buffer layer to diffuse more deeply into the substrate interior from the surface thereof to make it possible to increase the resistivity of the Si substrate around the boundary with the AlN buffer layer.

In the present invention, the Si substrate preferably has a main surface inclined toward a <112> direction by 0.1° to 1.5° from the (111) plane of a silicon single crystal. This allows improvement in the surface roughness of the upper surface of the group III nitride semiconductor layer.

In the present invention, the step of growing the group III nitride semiconductor layer preferably includes steps of: growing a first group III nitride semiconductor layer on the second AlN buffer layer at a third growth temperature; and growing a second group III nitride semiconductor layer on the first group III nitride semiconductor layer at a fourth growth temperature higher than the third growth temperature. In this case, the third growth temperature is preferably 400° C. to 800° C., and the fourth growth temperature is preferably 900° C. to 1200° C. Further, the thickness of the first group III nitride semiconductor layer is preferably 10 nm to 200 nm. Thus, by growing the first group III nitride semiconductor layer at a low temperature, it is possible to suppress the group III elements such as Ga from diffusing into the Si substrate through the AlN buffer layer to make it possible to prevent the resistivity of the surface of the Si substrate from decreasing.

In the present invention, a group III raw material and the N raw material are preferably alternately repeatedly fed in the step of growing the first group III nitride semiconductor layer.

In the present invention, the first group III nitride semiconductor layer is preferably made of AlGaN, and the second group III nitride semiconductor layer is preferably made of GaN.

In the present invention, a resistivity of the Si substrate is preferably 100 $\Omega$cm or more, the Si substrate preferably contains an impurity element selected from C, Ge, Sn, O, H, and a group V element, and the concentration of the impurity element contained at least in a surface layer part of the Si substrate ranging from the surface to the depth of 0.5 um to 10 um is preferably $1\times10^{12}$ atoms/cm$^3$ to $1\times10^{20}$ atoms/cm$^3$. This allows suppression of an increase in the number of carriers caused due to the diffusion of the group III elements into the Si substrate during formation of the AlN buffer layer.

In the present invention, the concentration of the impurity element contained in the entire Si substrate including the surface layer part may be $1\times10^{12}$ atoms/cm$^3$ to $1\times10^{20}$ atoms/cm$^3$. Alternatively, the concentration of impurity element contained in a deeper area than the surface layer part may be lower than the concentration in the surface layer part.

When the impurity element is C, the concentration of the impurity element contained in the surface layer part is preferably $1\times10^{14}$ atoms/cm$^3$ to $1\times10^{17}$ atoms/cm$^3$. When the impurity element is Ge or Sn, the concentration of the impurity element contained in the surface layer part is preferably $1\times10^{14}$ atoms/cm$^3$ to $1\times10^{20}$ atoms/cm$^3$.

When the impurity element is O, the concentration of the impurity element contained in the surface layer part is preferably $1\times10^{15}$ atoms/cm$^3$ to $5\times10^{18}$ atoms/cm$^3$. When the impurity element is H, the concentration of the impurity element contained in the surface layer part is preferably $1\times10^{15}$ atoms/cm$^3$ to $5\times10^{18}$ atoms/cm$^3$.

When the impurity element contains at least one group V element selected from N, P, As, and Sb, the concentration of the impurity element contained in the surface layer part is preferably $1\times10^{12}$ atoms/cm$^3$ to $1\times10^{19}$ atoms/cm$^3$, and the concentration of the impurity element contained in a deeper area than the surface layer part is preferably $1\times10^{14}$ atoms/cm$^3$ or less. In this case, the impurity element in the Si substrate preferably has a concentration gradient in which the concentration thereof is reduced toward the substrate interior from the surface.

In the present invention, a raw material containing a group V element (P, As, Sb) other than N is preferably fed together with the Al raw material and N raw material in the step of growing the first AlN buffer layer. This allows an impurity element for suppressing an increase in the number of carriers in the Si substrate, which is caused due to the diffusion of the group III elements into the Si substrate, to be contained not in the Si substrate but in the AlN buffer layer.

A method for manufacturing a group III nitride semiconductor substrate according to a third aspect of the present invention includes the steps of: growing an AlN buffer layer on an Si substrate at a growth temperature of 900° C. to 1200° C.; and growing a group III nitride semiconductor layer on the AlN buffer layer, wherein a resistivity of the Si substrate is 100 $\Omega$cm or more, the Si substrate contains an impurity element selected from C, Ge, Sn, O, and H, and the concentration of the impurity element contained at least in a surface layer part of the Si substrate ranging from the surface to the depth of 0.5 um to 10 um is $1\times10^{14}$ atoms/cm$^3$ to $1\times10^{20}$ atoms/cm$^3$. According to the present invention, it is possible to suppress an increase in the number of carriers caused due to the diffusion of group III elements into the Si substrate during formation of the AlN buffer layer.

In the present invention, the concentration of the impurity element contained in the entire Si substrate including the surface layer part may be $1\times10^{12}$ atoms/cm$^3$ to $1\times10^{20}$ atoms/cm$^3$. Alternatively, the concentration of impurity element contained in a deeper area than the surface layer part may be lower than the concentration in the surface layer part.

When the impurity element is C, the concentration of the impurity element contained in the surface layer part is preferably $1\times10^{14}$ atoms/cm$^3$ to $1\times10^{17}$ atoms/cm$^3$. When the impurity element is Ge or Sn, the concentration of the impurity element contained in the surface layer part is preferably $1\times10^{14}$ atoms/cm$^3$ to $1\times10^{20}$ atoms/cm$^3$.

When the impurity element is O, the concentration of the impurity element contained in the surface layer part is preferably $1\times10^{15}$ atoms/cm$^3$ to $5\times10^{18}$ atoms/cm$^3$. When the impurity element is H, the concentration of the impurity element contained in the surface layer part is preferably $1\times10^{15}$ atoms/cm$^3$ to $5\times10^{18}$ atoms/cm$^3$.

When the impurity element contains at least one group V element selected from N, P, As, and Sb, the concentration of the impurity element contained in the surface layer part is preferably $1\times10^{12}$ atoms/cm$^3$ to $1\times10^{19}$ atoms/cm$^3$, and the concentration of the impurity element contained in a deeper area than the surface layer part is preferably $1\times10^{14}$ atoms/cm$^3$ or less. In this case, the impurity element in the Si substrate preferably has a concentration gradient in which the concentration thereof is reduced toward the substrate interior from the surface.

The method for manufacturing a group III nitride semiconductor substrate according to the present invention preferably further includes a step of applying heat treatment at 900° C. to 1450° C. to the Si substrate on which the AlN buffer layer has been grown before growing the group III nitride semiconductor layer. This allows the group III elements that have diffused into the Si substrate during formation of the AlN buffer layer to diffuse more deeply into the substrate interior from the surface thereof to make it possible to increase the resistivity of the Si substrate around the boundary with the AlN buffer layer.

In the present invention, the Si substrate preferably has a main surface inclined toward a <112> direction by 0.1° to 1.5° from the (111) plane of a silicon single crystal. This allows improvement in the surface roughness of the upper surface of the group III nitride semiconductor layer.

A method for manufacturing a group III nitride semiconductor substrate according to a fourth aspect of the present invention includes the steps of: growing an AlN buffer layer on an Si substrate; applying heat treatment at 900° C. to 1450° C. to the Si substrate on which the AlN buffer layer has been grown; and growing a group III nitride semiconductor layer on the AlN buffer layer that has been subjected to the heat treatment. According to the present invention, it is possible to allow the group III elements that have diffused into the Si substrate during formation of the AlN buffer layer to diffuse more deeply into the substrate interior from the surface thereof to make it possible to increase the resistivity of the Si substrate around the boundary with the AlN buffer layer.

A method for manufacturing a group III nitride semiconductor substrate according to a fifth aspect of the present invention includes the steps of: growing an AlN buffer layer on an Si substrate; and growing a group III nitride semiconductor layer on the AlN buffer layer, wherein the Si substrate has a main surface inclined toward a <112> direction by 0.1° to 1.5° from the (111) plane of a silicon single crystal. This allows improvement in the surface roughness of the upper surface of the group III nitride semiconductor layer.

Advantageous Effects of the Invention

According to the present invention, there can be provided a method for manufacturing a group III nitride semiconductor substrate, capable of suppressing a reduction in resistivity of the surface of an Si substrate due to the diffusion of group III elements into the Si substrate when a group III nitride semiconductor layer is grown on the Si substrate through an AlN buffer layer.

BRIEF DESCRIPTION OF THE DRAWINGS

FIG. 1 is a schematic cross-sectional view illustrating the structure of a group III nitride semiconductor substrate according to a first embodiment of the present invention.

FIG. 13 is a table showing the evaluation results of the crystallinity of the GaN layer, impurity concentration on the surface of the Si substrate, and carrier concentration of the Si substrate in the group III nitride semiconductor substrates of Examples 1 to 20 and Comparative Examples 1 to 3.

FIG. 14 is a table showing the evaluation results of the surface roughness of the group III nitride semiconductor substrates of Examples 21 and 22 and Comparative Examples 4 to 7.

DETAILED DESCRIPTION OF THE EMBODIMENTS

Figure 2:
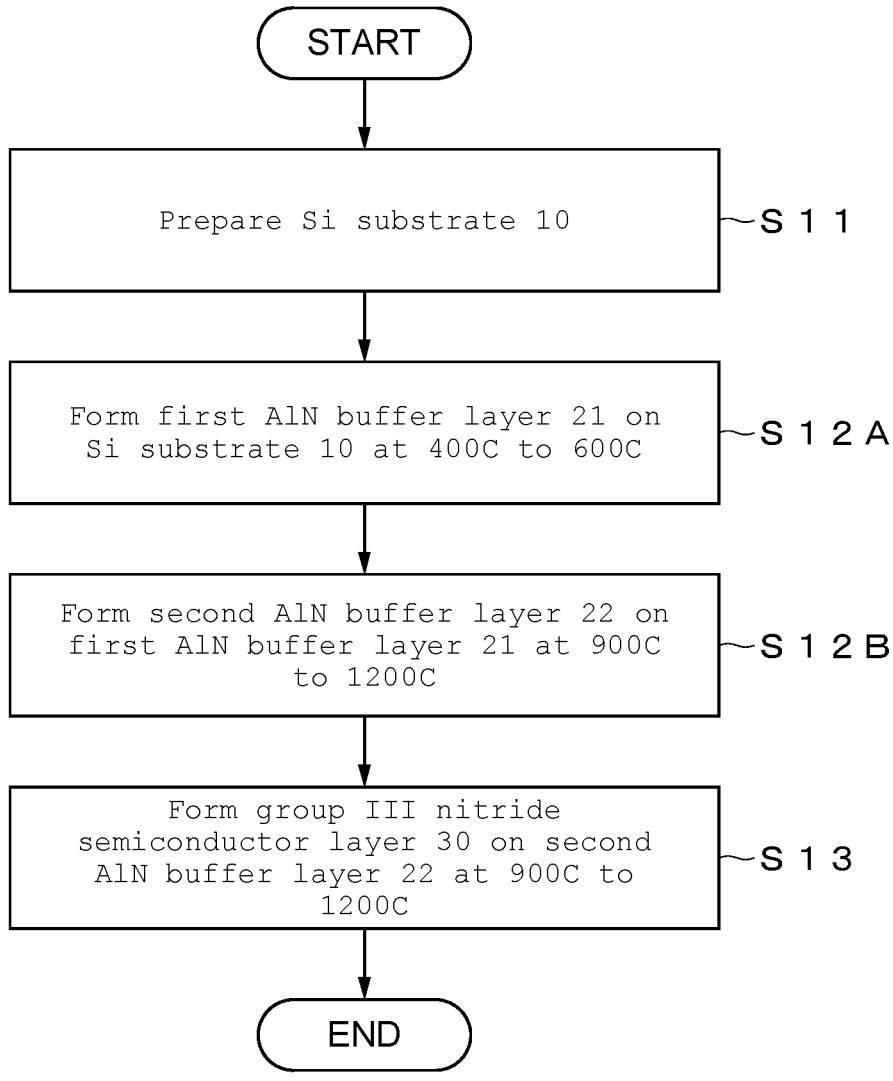
FIG. 2 is a flowchart for explaining a method for manufacturing the group III nitride semiconductor substrate 1.

Hereinafter, preferred embodiments of the present invention will be described in detail with reference to the accompanying drawings.

Figure 1:
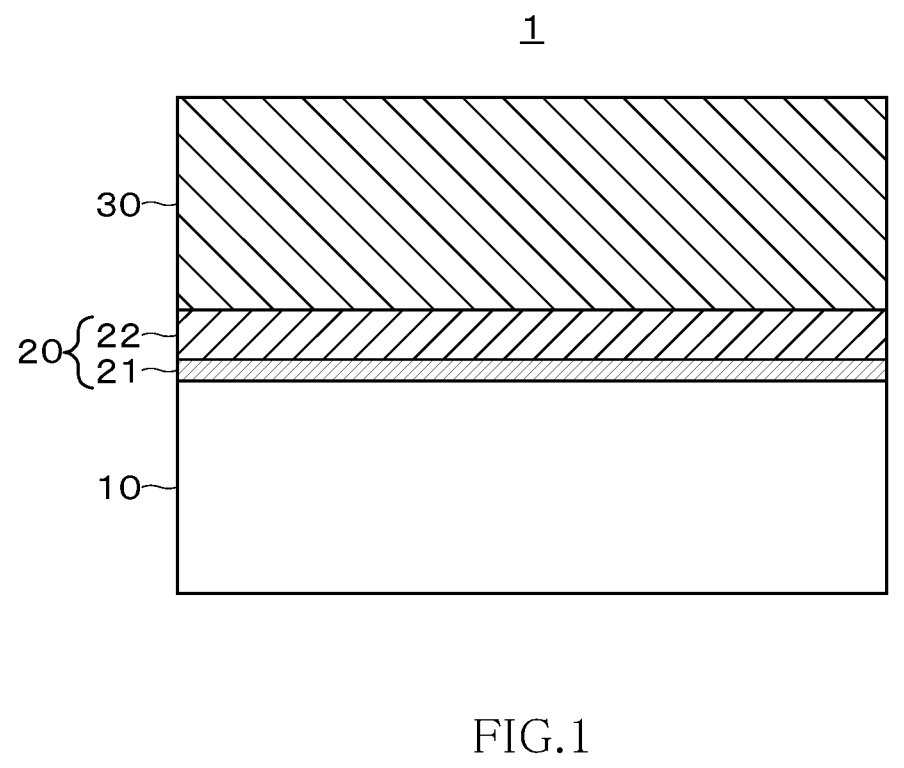

FIG. 1 is a schematic cross-sectional view illustrating the structure of a group III nitride semiconductor substrate according to a first embodiment of the present invention.

As illustrated in FIG. 1, a group III nitride semiconductor substrate 1 has a structure in which an AlN buffer layer 20 and a group III nitride semiconductor layer 30 are laminated in this order on an Si substrate 10. The resistivity of the Si substrate 10 is preferably 1000 Ωcm or more. Further, the plane orientation of the Si substrate 10 is preferably a (111) plane, but not limited thereto.

The AlN buffer layer 20 is a layer for reducing the lattice mismatch between the Si substrate 10 and the group III nitride semiconductor layer 30 and has a double-layer structure in which a first AlN buffer layer 21 and a second AlN buffer layer 22 are laminated in this order. The first AlN buffer layer 21 is a layer grown at a low temperature of 400° C. to 800° C., preferably, 400° C. to 600° C., and the second AlN buffer layer 22 is a layer grown at a high temperature of 900° C. to 1200° C.

The thickness of the first AlN buffer layer 21 is preferably 0.4 nm to 100 nm, and more preferably, 0.4 nm to 50 nm. When the thickness of the first AlN buffer layer 21 is smaller than 0.4 nm, the diffusion of group III elements into the Si substrate 10 cannot be suppressed, and when the thickness thereof exceeds 100 nm, the crystallinity of AlN is deteriorated, which in turn deteriorates the crystallinity of the group III nitride semiconductor layer 30 formed thereon.

The thickness of the AlN buffer layer 20, i.e., the total thickness of the first and second AlN buffer layers 21 and 22 is preferably 30 nm to 200 nm. When the thickness of the AlN buffer layer 20 is smaller than 30 nm, the crystallinity of the AlN buffer layer 20 cannot be improved, and when the thickness thereof exceeds 200 nm, cracks become likely to occur in the AlN buffer layer 20.

The group III nitride semiconductor layer 30 is a layer formed of a mixed crystal of at least one of Al, In, and Ga which are group III elements and N, and a typical group III nitride semiconductor is GaN. The thickness of the group III nitride semiconductor layer 30 is not particularly limited and may be, e.g., 1 um.

FIG. 2 is a flowchart for explaining a method for manufacturing the group III nitride semiconductor substrate 1.

As illustrated in FIG. 2, in the manufacture of the group III nitride semiconductor substrate 1, the Si substrate 10 is first prepared (step S11). Specifically, the Si substrate 10 is washed with HF and SC-1 and then set in an MOCVD (Metal Organic Chemical Vapor Deposition) furnace. Although MOCVD is preferably adopted as a film formation technique for the group III nitride semiconductor, other growth techniques such as HVPE (Hydride Vapor Phase Epitaxy) and MBE (Molecular Beam Epitaxy) may be adopted, and these techniques can suppress impurity diffusion into the Si substrate to the same extent.

Then, the first AlN buffer layer 21 is formed on the Si substrate 10 (step S12A). In the formation of the first AlN buffer layer 21, TMA (trimethylaluminum) and $NH_3$ are introduced into the furnace kept at 400° C. to 600° C. together with an $H_2$ carrier gas to grow AlN on the surface of the Si substrate 10. The growth temperature of the first AlN buffer layer 21 is preferably 400° C. to 600° C. When the growth temperature is lower than 400° C., the crystallinity of AlN is deteriorated to affect the future crystallinity of a group III nitride semiconductor substrate, and when the growth temperature is higher than 600° C., an effect of suppressing the diffusion of the group III elements into the Si substrate 10 is small. When the growth temperature of the first AlN buffer layer 21 is 600° C. or lower, the effect of suppressing the diffusion of the group III elements into the Si substrate 10 can be sufficiently enhanced.

In the formation of the first AlN buffer layer 21, TMA is preferably introduced prior to the introduction of $NH_3$. When $NH_3$ is introduced prior to the introduction of TMA, the surface of the Si substrate 10 reacts with $NH_3$ to be nitrided, failing to grow ALN having good crystallinity. Particularly, when the Si substrate 10 has uneven in-plane temperature distribution, the introduction of TMA prior to the introduction of $NH_3$ can avoid a situation where the surface of the Si substrate 10 is roughened to affect the future crystallinity of AlN or InAlGaN.

When TMA is introduced prior to the introduction of $NH_3$, TMA is fed 3 seconds to 30 seconds prior to the feeding of $NH_3$ so that Al atom in which TMA is decomposed is distributed to the entire surface of the Si substrate 10 in a thickness corresponding to one to ten atomic layers. When the Al atomic layer is thinner than one atomic layer, the Si substrate reacts with $NH_3$ to be nitrided, deteriorating the crystallinity. On the other hand, when the Al atomic layer is thicker than ten atomic layers, Al droplets are generated to be alloyed with Si. As a result, deterioration in the crystallinity of AlN occurs on the alloyed substrate.

The Si substrate 10 may be baked before growing the first AlN buffer layer 21 for the purpose of removing an oxide film on the surface of the Si substrate 10. The baking temperature at this time is preferably equal to or higher than the growth temperature of the first AlN buffer layer 21. However, when a group III raw material of Ga or the like introduced in the previous batch remains in the furnace, the baking is preferably not performed because the group III raw material may be taken in the Si substrate 10.

Then, the second AlN buffer layer 22 is formed on the first AlN buffer layer 21 (step S12B). In the formation of the second AlN buffer layer 22, first the temperature inside the furnace is raised to 900° C. to 1200° C. Although feeding of the raw material may be interrupted during temperature rise, it is preferable to raise the temperature while feeding a raw material in terms of productivity. The growth temperature of the second AlN buffer layer 22 is preferably 900° C. to 1200° C. When the growth temperature is lower than 900° C., the crystallinity of the AlN cannot be improved, and an ordinary apparatus cannot support crystal growth at a high temperature exceeding 1200° C.

Then, the group III nitride semiconductor layer 30 is formed on the second AlN buffer layer 22 (step S13). In the formation of the group III nitride semiconductor layer 30, first the feed of TMA is stopped and, instead, a group III raw material is fed together with $NH_3$ to grow the group III nitride semiconductor layer 30. The growth temperature of the group III nitride semiconductor layer 30 is preferably 900° C. to 1200° C. When the growth temperature is lower than 900° C., the crystallinity of the group III nitride semiconductor layer cannot be improved. Thus, the group III nitride semiconductor substrate 1 in which the first AlN buffer layer 21, second AlN buffer layer 22, and group III nitride semiconductor layer 30 are laminated in this order is completed.

In the process of growing the group III nitride semiconductor layer 30 on the Si substrate 10 through the AlN buffer layer 20, when the AlN buffer layer 20 is grown at a high temperature of 900° C. or higher from the initial stage of growth thereof for obtaining good crystallinity, the Si substrate 10 may react with an Al raw material or a group III raw material such as Ga or In remaining in the furnace to cause the group III elements to diffuse into the Si substrate 10 to disadvantageously reduce the resistivity of the surface of the Si substrate 10. However, when the first AlN buffer layer 21 is grown thin at a low temperature of 400° C. to 600° C. first, and then the second AlN buffer layer 22 is grown at a high temperature of 900° C. 1200° C., reaction between the Si substrate and the group III raw material can be suppressed.

As described above, in the method for manufacturing the group III nitride semiconductor substrate 1 according to the present embodiment, the AlN buffer layer 20 is grown at two temperature stages including application of a low temperature of 400° C. to 600° C. and application of a high temperature of 900° C. to 1200° C., so that it is possible to reduce the diffusion of the group III elements into the Si substrate 10 while maintaining the crystal quality of the AlN buffer layer 20 and thereby to prevent a reduction in the resistivity of the surface of the Si substrate 10.

Figure 3:
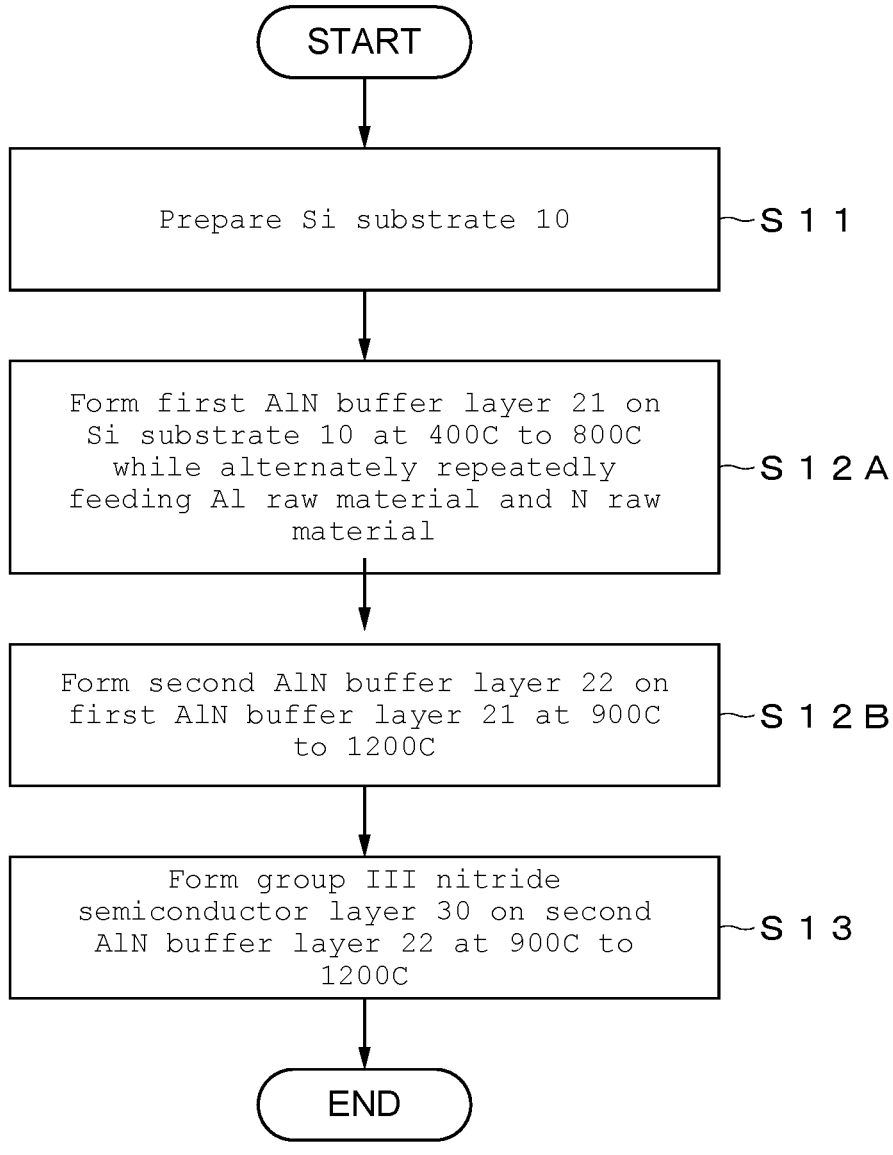
FIG. 3 is a flowchart for explaining a method for manufacturing the group III nitride semiconductor substrate according to a second embodiment of the present invention.

FIG. 3 is a flowchart for explaining a method for manufacturing the group III nitride semiconductor substrate according to a second embodiment of the present invention.

As illustrated in FIG. 3, the method for manufacturing the group III nitride semiconductor substrate 1 according to the present embodiment is featured in that TMA as an Al raw material and $NH_3$ as an N raw material are fed not simultaneously but alternately and repeatedly upon formation of the first AlN buffer layer 21 (step S12A). That is, the manufacturing method according to the present embodiment includes a step of preparing the Si substrate 10 (step S11), a step of alternately and repeatedly feeding the Al raw material and N raw material to form the first AlN buffer layer 21 on the Si substrate 10 (step S12A), a step of forming the second AlN buffer layer 22 on the first AlN buffer layer 21 (step S12B), and a step of forming the group III nitride semiconductor layer 30 on the second AlN buffer layer 22 (step S13). Other conditions are the same as in the first embodiment.

For example, in the alternate feeding of TMA and $NH_3$, a process of introducing TMA for 3 seconds, introducing only the $H_2$ carrier gas for 3 seconds, introducing $NH_3$ for 3 seconds, and introducing only the $H_2$ carrier gas for 6 seconds is repeated. By alternately introducing the Al raw material and N raw material into the furnace, the crystallinity can be improved even when AlN is grown at a low temperature.

TMA and $NH_3$ are each preferably fed for 0.5 seconds to 10 seconds. When the feeding time of TMA is less than 0.5 seconds, the growth rate of AlN is reduced to deteriorate productivity, and when the feeding time of TMA exceeds 10 seconds, the crystallinity of AlN is deteriorated. When the feeding time of $NH_3$ is less than 0.5 seconds, Al droplets remain on a growth surface to inhibit crystal growth, and when the feeding time of $NH_3$ exceeds 10 seconds, nitriding of the Si substrate advances due to excessive feeding of $NH_3$ in the initial stage of the growth of AlN, deteriorating the crystallinity of AlN. The suspension time of raw material feeding is preferably 0 seconds to 10 seconds. Although curtailment or elimination of the raw material feeding suspension time has no significant effect on the crystallinity, the raw material feeding suspension time longer than 10 seconds deteriorates productivity.

In the introduction of AlN raw material, TMA is preferably introduced prior to the introduction of $NH_3$. When $NH_3$ is introduced prior to TMA, the surface of the Si substrate 10 reacts with $NH_3$ to be nitrided, failing to grow AlN having good crystallinity. Particularly, when the Si substrate 10 has uneven in-plane temperature distribution, the introduction of TMA prior to the introduction of $NH_3$ can avoid a situation where the surface of the Si substrate 10 is roughened to affect the future crystallinity of AlN or InAlGaN.

When TMA is introduced prior to the introduction of $NH_3$, TMA is fed 3 seconds to 30 seconds prior to the feeding of $NH_3$ so that Al atom in which TMA is decomposed is distributed to the entire surface of the Si substrate 10 in a thickness corresponding to one to ten atomic layers. When the Al atomic layer is thinner than one atomic layer, the Si substrate reacts with $NH_3$ to be nitrided, deteriorating the crystallinity. On the other hand, when the Al atomic layer is thicker than ten atomic layers, Al droplets are generated to be alloyed with Si. As a result, deterioration in the crystallinity of AlN occurs on the alloyed substrate.

The growth temperature of the first AlN buffer layer 21 is preferably 400° C. to 800° C. and, more preferably, 400° C. to 600° C. When the growth temperature is lower than 400° C., the crystallinity of AlN cannot be improved, and when the growth temperature is higher than 800° C., the effect of suppressing the diffusion of the group III elements into the Si substrate 10 is small. When TMA and $NH_3$ are alternately fed, it is possible to grow AlN having good crystallinity even at a comparatively low temperature, so that it is effective to set the growth temperature of the first AlN buffer layer 21 to 600° C. or lower. When the growth temperature of the first AlN buffer layer 21 is 600° C. or lower, the effect of suppressing the diffusion of the group III elements into the Si substrate 10 can be sufficiently enhanced. Further, the alternate feeding of TMA and $NH_3$ can not only improve the crystallinity of AlN, but also enhance the effect of suppressing the diffusion of the group III elements and is thus advantageous when AlN is grown at a temperature of 600° C. or higher.

In the formation of the second AlN buffer layer 22 (step S12B), TMA as an Al raw material and $NH_3$ as an N raw material are fed simultaneously. As described above, at a low temperature of 800° C. or lower, the alternate feeding of TMA and $NH_3$ can improve the crystallinity. On the other hand, at a high temperature of 900° C. or higher, continuous feeding of TMA and $NH_3$ can reduce the growth time to improve productivity while improving the crystallinity.

As described above, in the method for manufacturing the group III nitride semiconductor substrate 1 according to the present embodiment, the AlN buffer layer 20 is grown at two temperature stages including application of a low temperature of 400° C. to 800° C. and application of a high temperature of 900° C. to 1200° C., and the Al raw material and N raw material are alternately fed in the formation of the first AlN buffer layer 21, so that it is possible to improve the crystallinity of the AlN buffer layer 20 and particularly to suppress deterioration in the crystallinity that may be caused when the first AlN buffer layer 21 is grown at a low temperature of 400° C. to 600° C. Further, even at a high temperature of 600° C. or higher, the diffusion of the group III elements can be sufficiently suppressed.

Figure 4:
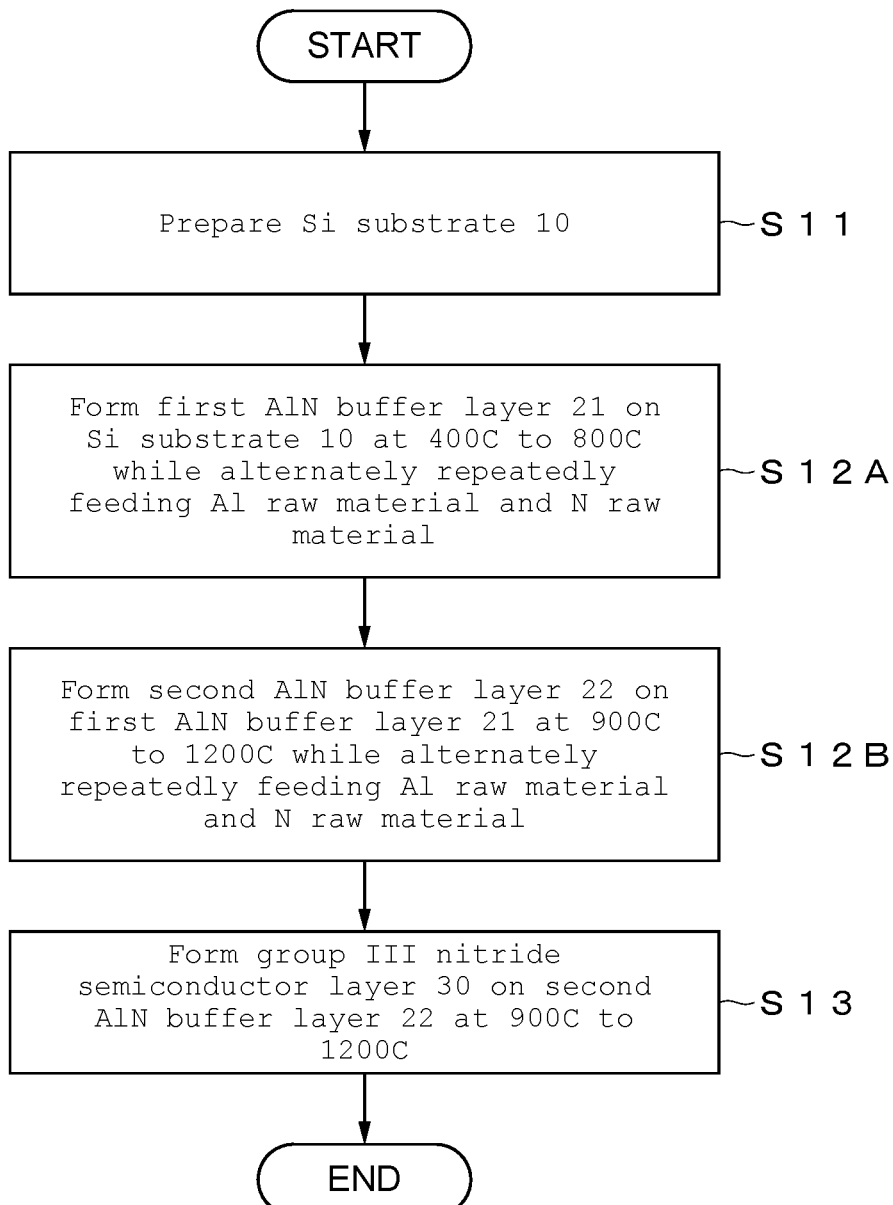
FIG. 4 is a flowchart for explaining a method for manufacturing the group III nitride semiconductor substrate 1 according to a third embodiment of the present invention.

FIG. 4 is a flowchart for explaining a method for manufacturing the group III nitride semiconductor substrate 1 according to a third embodiment of the present invention.

As illustrated in FIG. 4, the method for manufacturing the group III nitride semiconductor substrate 1 according to the present embodiment is featured in that TMA and $NH_3$ are alternately fed not only upon formation of the first AlN buffer layer 21 (step S12A), but also upon formation of the second AlN buffer layer 22 (step S12B). The alternate feeding conditions of TMA and $NH_3$ are the same as those for the first AlN buffer layer 21. Other conditions are also the same as in the second embodiment. According to the present embodiment, it is possible to further improve the crystallinity of the AlN buffer layer in addition to the effects of the second embodiment. That is, heterogeneous reaction between TMA and $NH_3$ on the substrate can be suppressed to improve the in-plane film thickness distribution of AlN. The alternate feeding of the raw material can not only improve the film thickness distribution of AlN, but also improve the concentration distribution of the group III nitride semiconductor layer serving as a device active layer. Although an effect of improving the uniformity of AlN is enhanced by alternately feeding the Al raw material and N raw material from the low-temperature growth time, it can be obtained even when the alternate feeding of the Al raw material and N raw material is performed only at the high-temperature growth time.

Figure 5:
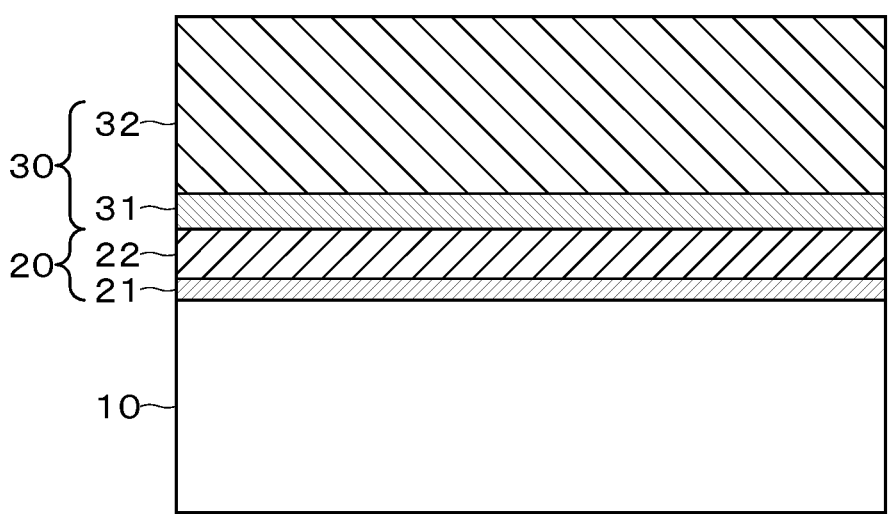
FIG. 5 is a schematic cross-sectional view illustrating the structure of a group III nitride semiconductor substrate according to a second embodiment of the present invention.

FIG. 5 is a schematic cross-sectional view illustrating the structure of a group III nitride semiconductor substrate according to a second embodiment of the present invention.

As illustrated in FIG. 5, a group III nitride semiconductor substrate 2 according to the present embodiment is featured in that the group III nitride semiconductor layer 30 has a double-layer structure in which a first group III nitride semiconductor layer 31 and a second group III nitride semiconductor layer 32 are laminated in this order. The first group III nitride semiconductor layer 31 is a layer grown at a low temperature of 400° C. to 800° C., and the second group III nitride semiconductor layer 32 is a layer grown at a high temperature of 900° C. to 1200° C. Other configurations are the same as in the first embodiment. With the double-layer structure of the group III nitride semiconductor layer 30, it is possible to suppress the group III elements from diffusing into the Si substrate 10 through the AlN buffer layer 20 and to improve the crystallinity of the group III nitride semiconductor layer 30.

Figure 6:
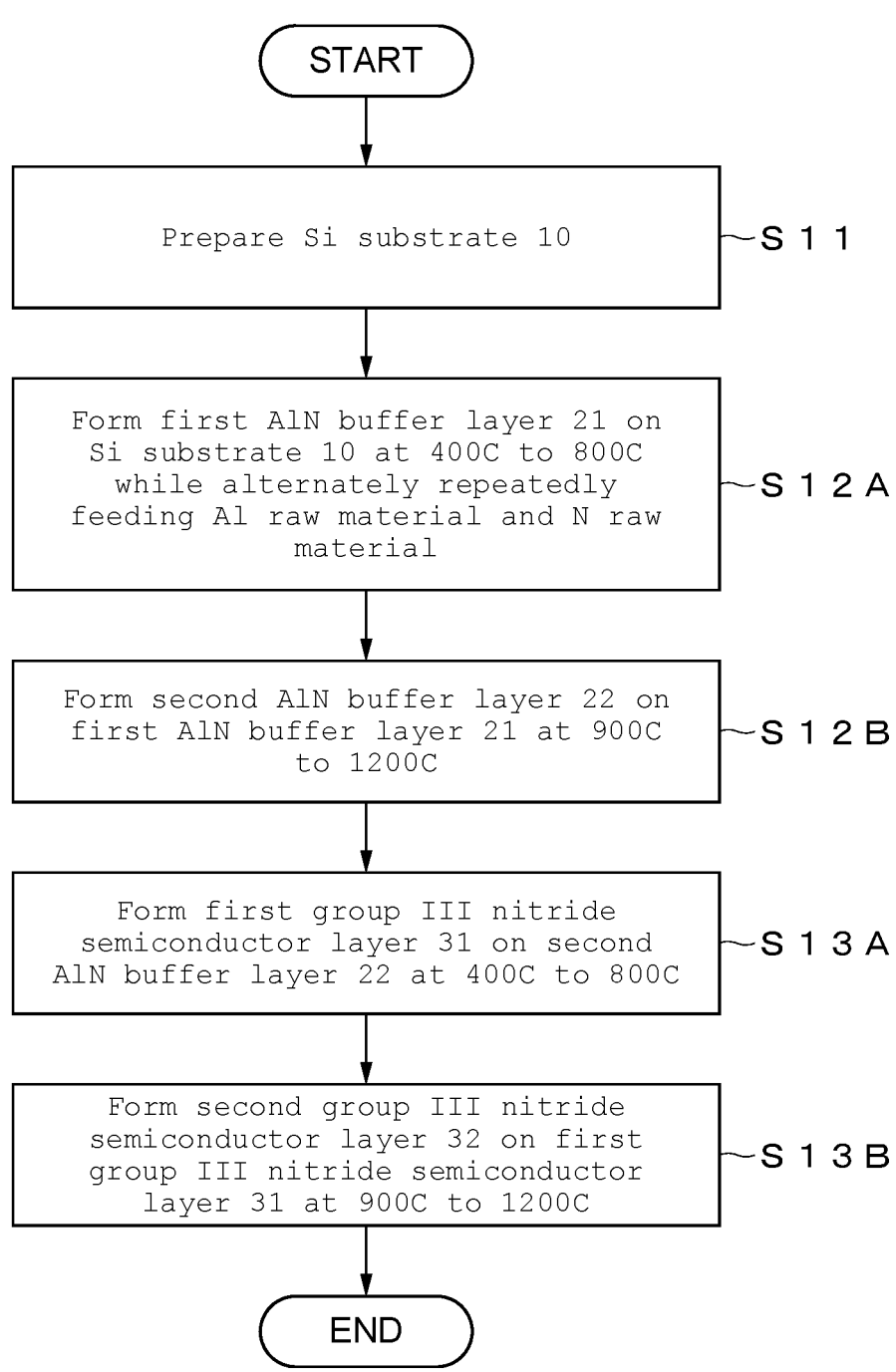
FIG. 6 is a flowchart for explaining a method for manufacturing the group III nitride semiconductor substrate according to a fourth embodiment of the present invention.

FIG. 6 is a flowchart for explaining a method for manufacturing the group III nitride semiconductor substrate according to a fourth embodiment of the present invention.

As illustrated in FIG. 6, the method for manufacturing the group III nitride semiconductor substrate 2 according to the present embodiment is featured in that, after formation of the first AlN buffer layer 21 and second AlN buffer layer 22 in this order on the Si substrate 10 (steps S12A and S12B), a step of forming the first group III nitride semiconductor layer 31 at 400° C. to 800° C. (step S13A) and a step forming the second group III nitride semiconductor layer 32 at 900° C. to 1200° C. (step S13B) are performed sequentially.

The growth temperature of the first group III nitride semiconductor layer 31 is preferably 400° C. to 800° C., and the growth temperature of the second group III nitride semiconductor layer 32 is preferably 900° C. to 1200° C. Further, the composition of the group III elements constituting the second group III nitride semiconductor layer 32 may differ from that of the first group III nitride semiconductor layer 31. Thus, for example, the first group III nitride semiconductor layer 31 may be an AlGaN layer, and the second group III nitride semiconductor layer 32 may be a GaN layer. When the first group III nitride semiconductor layer 31 is made of an AlGaN layer, an effect of suppressing the diffusion of Ga into Si substrate can be enhanced.

In the formation of the group III nitride semiconductor layer 30, feeding of TMA is stopped, and the temperature inside the furnace is lowered to 400° C. to 800° C. Although the feeding of $NH_3$ may be interrupted upon temperature lowering, it is preferable to lower the temperature while feeding $NH_3$ considering productivity. Thereafter, the group III raw material is fed together with $NH_3$ to grow the group III nitride semiconductor layer 30.

Also in the process of growing the group III nitride semiconductor layer 30 on the AlN buffer layer 20, the group III elements may diffuse into the Si substrate 10 through the first and second AlN buffer layers 21 and 22; however, the group III nitride semiconductor layer is grown at a low temperature of 400° C. to 800° C. in the early stage of growth (grown up to a thickness of 200 nm) and, thereafter, in a subsequent stage (grown to a thickness of 200 nm or more) the group III nitride semiconductor layer is grown at a high temperature of 900° C. to 1200° C. so as to improve the crystallinity, so that it is possible to further suppress diffusion of the group III elements into the Si substrate while maintaining the crystal quality of the group III nitride semiconductor. Further, upon growth of the group III nitride semiconductor layer at a low temperature, the group III raw material and group V raw material are alternately fed, so that the crystallinity of the group III nitride can be improved, thus suppressing deterioration in crystallinity that may be caused when the group III nitride semiconductor layer is grown at a low temperature of 400° C. to 600° C.

Figure 7:
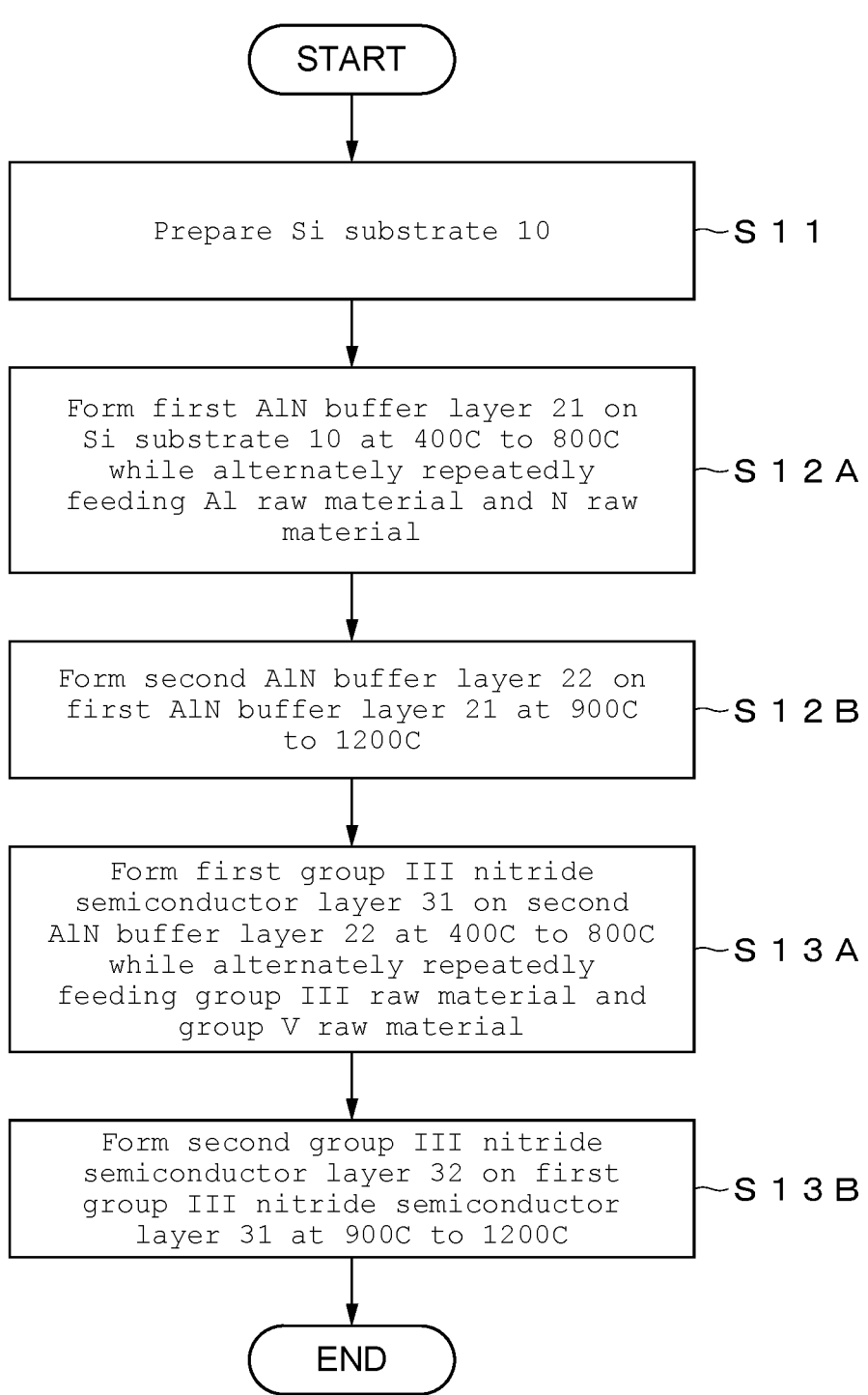
FIG. 7 is a flowchart for explaining a method for manufacturing the group III nitride semiconductor substrate according to a fifth embodiment of the present invention.

FIG. 7 is a flowchart for explaining a method for manufacturing the group III nitride semiconductor substrate according to a fifth embodiment of the present invention.

As illustrated in FIG. 7, the method for manufacturing the group III nitride semiconductor substrate 2 according to the present embodiment is featured in that the group III raw material and group V raw material are alternately fed not only in the formation of the first AlN buffer layer 21 (step S12A) but also in the formation of the first group III nitride semiconductor layer 31 (step S13A). Other conditions are the same as in the fourth embodiment. When the group III raw material and group V raw material are thus alternately introduced into the furnace upon growth of the first group III nitride semiconductor layer 31, the crystallinity at a low growth temperature can be improved.

Figure 8:
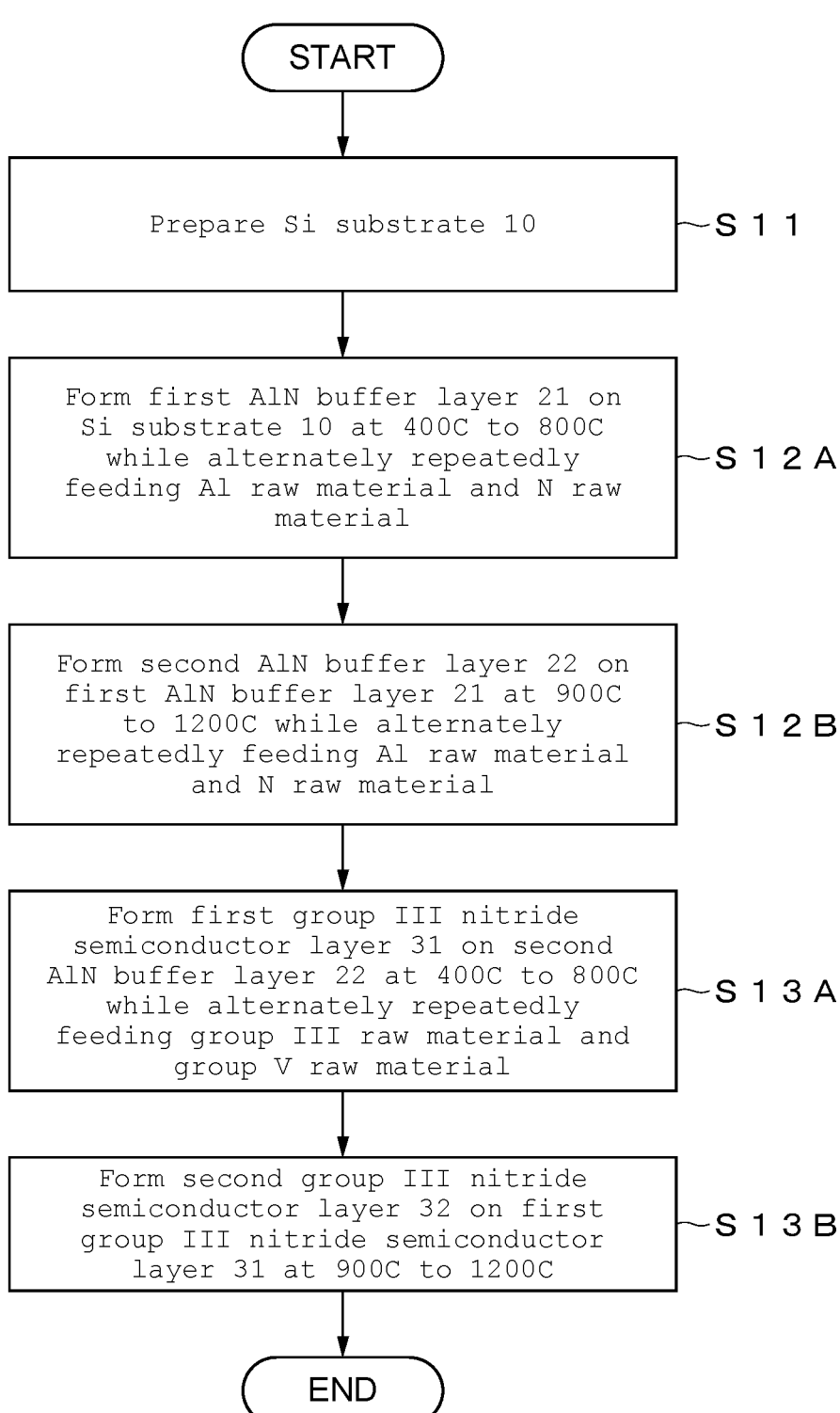
FIG. 8 is a flowchart for explaining a method for manufacturing the group III nitride semiconductor substrate according to a sixth embodiment of the present invention.

FIG. 8 is a flowchart for explaining a method for manufacturing the group III nitride semiconductor substrate according to a sixth embodiment of the present invention.

As illustrated in FIG. 8, the method for manufacturing the group III nitride semiconductor substrate according to the present embodiment is a combination of the third and fifth embodiments and is featured in that the group III raw material and group V raw material are alternately fed in the formation of the first AlN buffer layer 21, second AlN buffer layer 22, and first group III nitride semiconductor layer 31 (steps S12A, S12B, and S13A). Other conditions are the same as in the third and fifth embodiments. When the group III raw material and group V raw material are thus alternately introduced into the furnace upon growth of the AlN buffer layer and group III nitride semiconductor layer, the crystallinity at a low growth temperature can be further improved.

Figure 9:
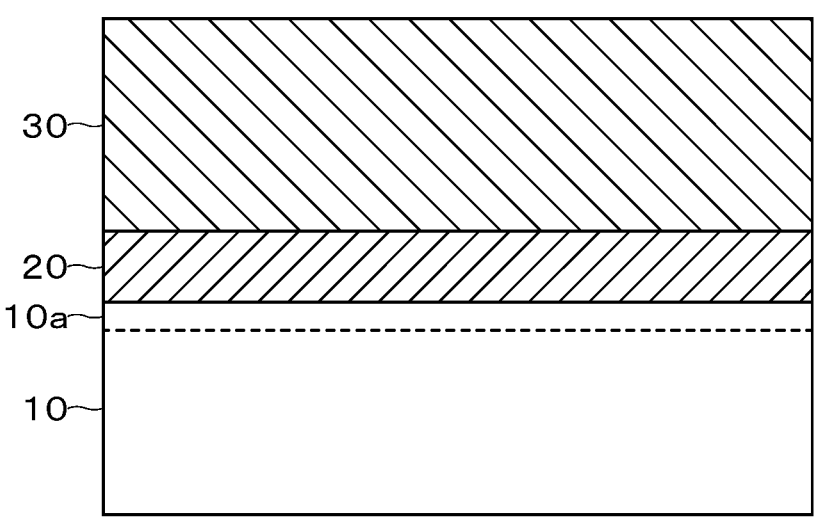
FIG. 9 is a schematic cross-sectional view illustrating the structure of a group III nitride semiconductor substrate according to a third embodiment of the present invention.

FIG. 9 is a schematic cross-sectional view illustrating the structure of a group III nitride semiconductor substrate according to a third embodiment of the present invention.

As illustrated in FIG. 9, a group III nitride semiconductor substrate 3 according to the present embodiment includes the Si substrate 10, the AlN buffer layer 20 formed on the Si substrate 10, and the group III nitride semiconductor layer 30 formed on the AlN buffer layer 20, wherein the AlN buffer layer 20 is a high-temperature buffer layer grown at 900° C. to 1200° C., and the Si substrate 10 contains an impurity such as C, Ge, Sn, O, H, or a group V element (N, P, As, Sb) which suppresses an increase in the number of carriers caused in association with the diffusion of the group III elements thereinto. Other configurations are the same as in the first embodiment.

Figure 10:
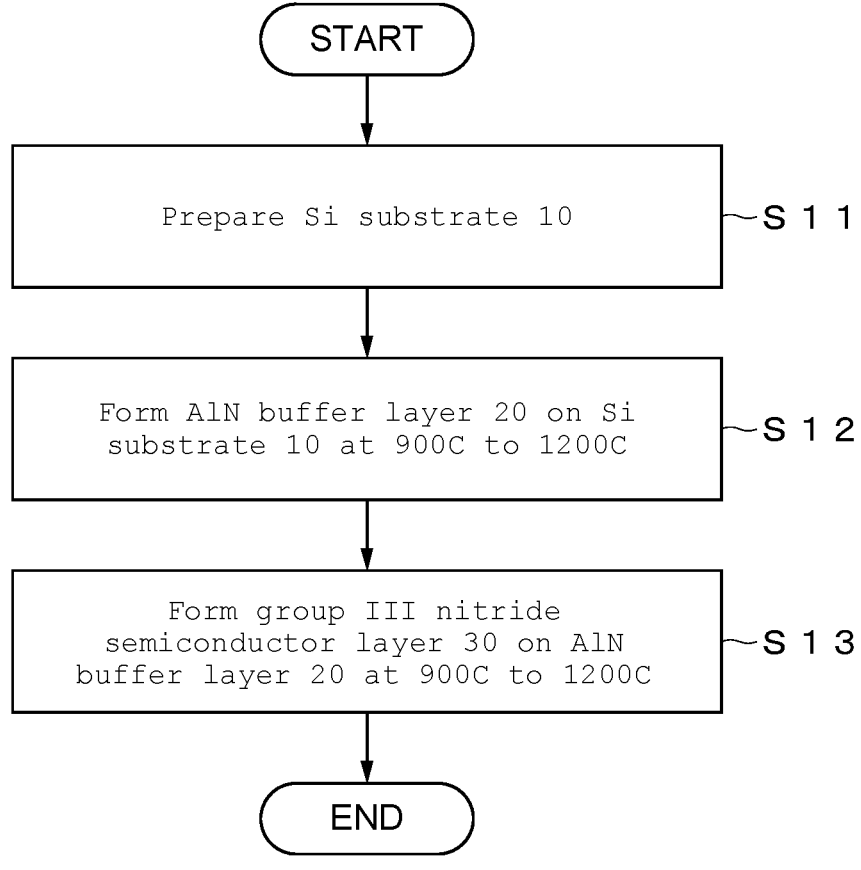
FIG. 10 is a flowchart for explaining a method for manufacturing the group III nitride semiconductor substrate according to a seventh embodiment of the present invention.

FIG. 10 is a flowchart for explaining a method for manufacturing the group III nitride semiconductor substrate according to a seventh embodiment of the present invention.

As illustrated in FIG. 10, in the method for manufacturing the group III nitride semiconductor substrate 3 according to the present embodiment, first the Si substrate 10 having a resistivity of 100 Ωcm or more and containing an impurity such as C, Ge, Sn, O, H, or a group V element (N, P, As, Sb) in an amount of $1 \times 10^{12}$ atoms/cm³ to $1 \times 10^{19}$ atoms/cm³ is prepared. The above impurity may be contained only in a surface layer part 10a ranging from the surface to the depth of 0.5 um to 10 um or may be contained throughout the substrate. The above impurity plays a role of suppressing an increase in the number of carriers caused due to the diffusion of the group III elements into the Si substrate 10.

<C>

When the Si substrate 10 contains C, the concentration of C in at least the surface layer part 10a is preferably $1 \times 10^{14}$ atoms/cm³ to $1 \times 10^{17}$ atoms/cm³. In this case, the concentration of C in the entire Si substrate may be $1 \times 10^{14}$ atoms/cm³ to $1 \times 10^{17}$ atoms/cm³. Alternatively, the concentration of C may be $1 \times 10^{14}$ atoms/cm³ to $1 \times 10^{17}$ atoms/cm³ only in the surface layer part 10a and $1 \times 10^{14}$ atoms/cm³ or less in the substrate interior located deeper than the surface layer part 10a.

<Ge, Sn>

When the Si substrate 10 contains Ge or Sn, the concentration of Ge or Sn in at least the surface layer part 10a is preferably $1 \times 10^{14}$ atoms/cm³ to $1 \times 10^{20}$ atoms/cm³. In this case, the concentration of Ge or Sn in the entire Si substrate may be $1 \times 10^{14}$ atoms/cm³ to $1 \times 10^{20}$ atoms/cm³. Alternatively, the concentration of Ge or Sn may be $1 \times 10^{14}$ atoms/cm³ to $1 \times 10^{17}$ atoms/cm³ only in the surface layer part 10a and $1 \times 10^{14}$ atoms/cm³ or less in the substrate interior located deeper than the surface layer part 10a.

<O>

The Si substrate 10 may contain a larger amount of O in the surface layer part 10*a*. In this case, the concentration of O in the entire Si substrate may be $1\times10^{15}$ atoms/cm$^3$ to $1\times10^{18}$ atoms/cm$^3$. Alternatively, the concentration of O may be $1\times10^{15}$ atoms/cm$^3$ to $1\times10^{18}$ atoms/cm$^3$ only in the surface layer part 10*a* and $1\times10^{14}$ atoms/cm$^3$ or less in the substrate interior located deeper than the surface layer part 10*a*. To increase the concentration of O only in the surface layer part 10*a* can be achieved by ion implantation into the Si substrate surface.

<H>

The Si substrate 10 may contain a larger amount of H in the surface layer part 10*a*. In this case, the concentration of H in the surface layer part 10*a* is preferably $1\times10^{15}$ atoms/cm$^3$ to $1\times10^{18}$ atoms/cm$^3$, and the H concentration in the substrate interior located deeper than the surface layer part 10*a* is preferably less than that in the surface layer part 10*a*, specifically, $1\times10^{14}$ atoms/cm$^3$ or less.

<Group V Element>

The Si substrate 10 may contain a larger amount of the group V element (N, P, As, Sb) in the surface layer part 10*a*. In this case, the concentration of the group V element in the surface layer part 10*a* is preferably $1\times10^{12}$ atoms/cm$^3$ to $1\times10^{19}$ atoms/cm$^3$, and the group V element concentration in the substrate interior located deeper than the surface layer part 10*a* is preferably less than that in the surface layer part 10*a*, specifically, $1\times10^{14}$ atoms/cm$^3$ or less. The concentration distribution in the depth direction of the group V element in the Si substrate 10 preferably has a gradient in which the concentration is highest in the surface and gradually reduced toward the substrate interior from the surface.

<Group V Element Other than N>

The group V element for suppressing an increase in the number of carriers due to the diffusion of the group III elements into the Si substrate 10 may be contained not in the Si substrate 10 but in the AlN buffer layer 20 contacting the surface of the Si substrate 10. The AlN buffer layer 20 containing the group V element for suppressing an increase in the number of carriers can be formed by introducing the group V element (P, As, Sb) other than N into the furnace together with the group III raw material in the formation process of the AlN buffer layer 20 (step S12) to be described later.

Then, the AlN buffer layer 20 is grown on the upper surface of the Si substrate 10 at a high temperature of 900° C. to 1200° C. (step S12). Even when the group III elements such as Al or Ga diffuses into the Si substrate 10 at this time, C, Ge, Sn, O, H or the group V element inactivates the carrier of the group III elements, making it possible to suppress a reduction in resistivity of the surface of the Si substrate 10. Thus, by using such a special Si substrate 10, it is possible to suppress a reduction in resistivity of the surface even when the group III elements such as Al or Ga diffuse in the Si substrate.

Thereafter, the group III nitride semiconductor layer 30 is grown on the AlN buffer layer 20 at a high temperature of 900° C. to 1200° C. (step S13), whereby the group III nitride semiconductor substrate 3 is completed.

As described above, when the AlN buffer layer 20 is grown at a high temperature of 900° C. to 1200° C. from the initial stage of growth thereof, the group III elements such as Al or Ga may diffuse into the Si substrate 10 to reduce the resistivity of the surface of the Si substrate 10. However, when the surface layer part 10*a* of the Si substrate 10 contains the impurity that suppresses an increase in the number of carriers caused due to the diffusion of the group III elements into the Si substrate 10, it is possible to suppress a reduction in the resistivity of the surface of the Si substrate 10 even when the group III elements diffuses into the Si substrate 10. This allows the AlN buffer layer 20 to be grown at a high temperature of 900° C. to 1200° C. from the initial stage of growth thereof, making it possible to improve the crystallinity of AlN.

The Si substrate containing the impurity such as C that suppresses an increase in the number of carriers due to the diffusion of the group III elements can be adopted in the method for manufacturing the group III nitride semiconductor substrate according to the above first to sixth embodiments; however, in this case, the concentration (group V diffusion profile) of the impurity in the substrate needs to be determined considering the diffusion amount (group III diffusion profile) of the group III elements. That is, when a process for suppressing the diffusion of the group III elements is not applied as in the case where the AlN buffer layer is grown only at a high temperature of 900° C. to 1200° C., the diffusion amount of the group III elements becomes large, so that it is necessary to increase the concentration of the impurity in the Si substrate, while when a process having a high effect against the diffusion of the group III elements is applied as in the sixth embodiment, the diffusion amount of the group III elements into the Si substrate is very small, so that it is necessary to reduce the impurity concentration in the Si substrate.

Figure 11:
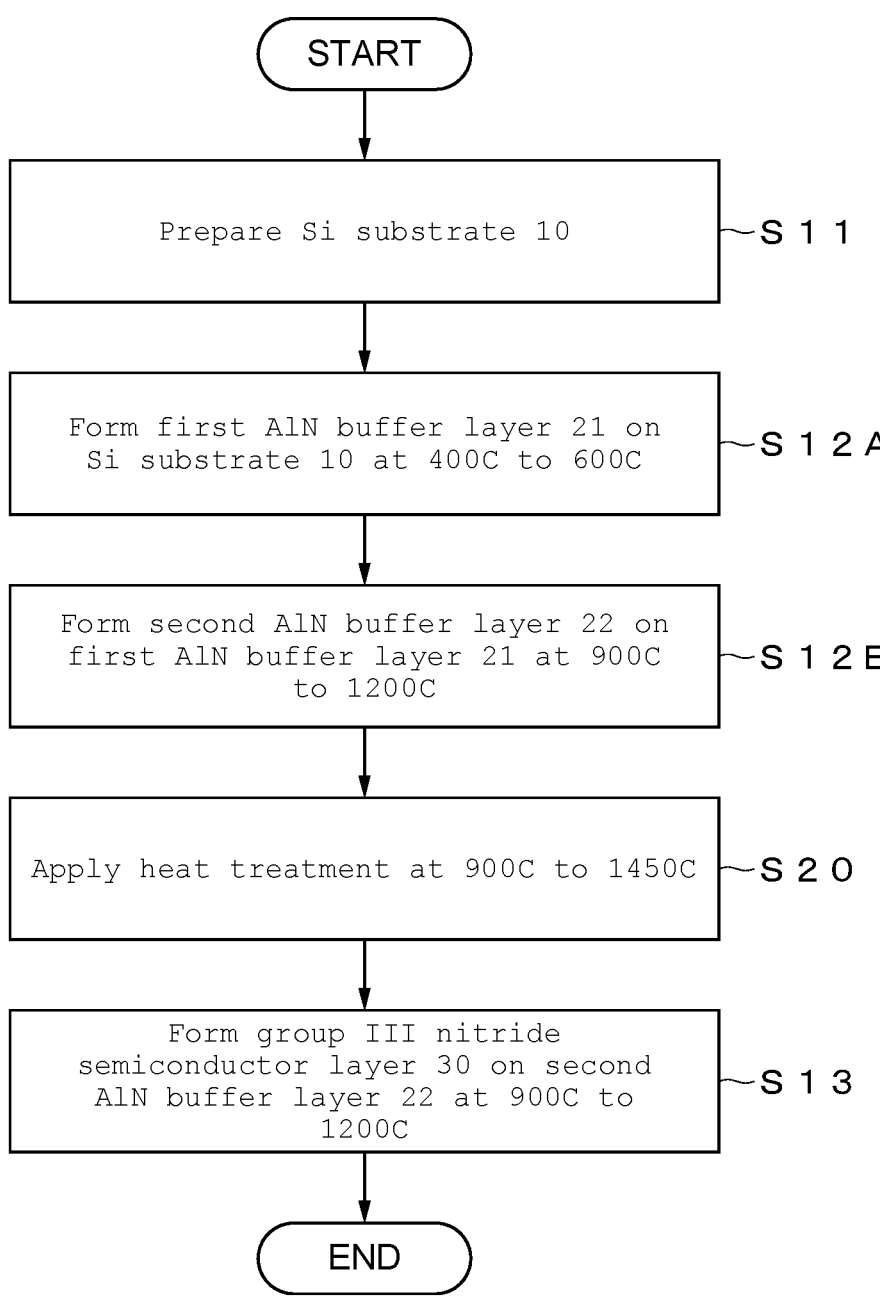
FIG. 11 is a flowchart for explaining a method for manufacturing the group III nitride semiconductor substrate according to an eighth embodiment of the present invention.

FIG. 11 is a flowchart for explaining a method for manufacturing the group III nitride semiconductor substrate according to an eighth embodiment of the present invention.

As illustrated in FIG. 11, the method for manufacturing the group III nitride semiconductor substrate 1 according to the present embodiment is featured in that heat treatment of 900° C. to 1450° C. is performed after formation of the AlN buffer layer 20 on the Si substrate 10 and before formation of the group III nitride semiconductor layer 30. That is, the manufacturing method according to the present embodiment includes a step of preparing the Si substrate 10 (step S11), a step of forming the first AlN buffer layer 21 on the Si substrate 10 (step 12A), a step of forming the second AlN buffer layer 22 on the first AlN buffer layer 21 (step S12B), a step of applying heat treatment to the Si substrate 10 (step S20), and a step of forming the group III nitride semiconductor layer 30 on the second AlN buffer layer 22 (step S13). Other conditions are the same as in the first embodiment.

The heat treatment is preferably performed under an NH3 atmosphere and in the same furnace as used in the formation of the AlN buffer layer 20 as a sequential process; however, it may be performed in another heat treatment furnace. When the heat treatment is performed in the same furnace, high temperature is poorly controlled; on the other hand, productivity can be improved by process simplification. The time for the heat treatment is preferably 5 minutes to 1 hour. When the heat treatment time is less than 5 minutes, diffusion distance is too small to recover the resistivity sufficiently, and when the heat treatment time exceeds 1 hour, productively is deteriorated.

As described above, the heat treatment temperature is preferably 900° C. to 1450° C. When the heat treatment temperature is lower than 900° C., diffusion distance is small, so that heat treatment time needs to be increased correspondingly, and when the heat treatment temperature is higher than 1450° C., the Si substrate 10 is melted. By thus performing heat treatment after formation of the AlN buffer layer 20, it is possible to further diffuse the group III elements that has diffused into the Si substrate 10 upon formation of the AlN buffer layer 20 from the surface of the substrate to the interior thereof and to thereby suppress a reduction in the resistivity of the substrate surface.

While the heat treatment (step S20) in the present embodiment is applied to the first embodiment, it may also be applied to the second to seventh embodiments. Further, the heat treatment is particularly effective for when the AlN buffer layer 20 and group III nitride semiconductor layer 30 illustrated in FIG. 10 are formed using the Si substrate having a normal configuration.

Figure 12:
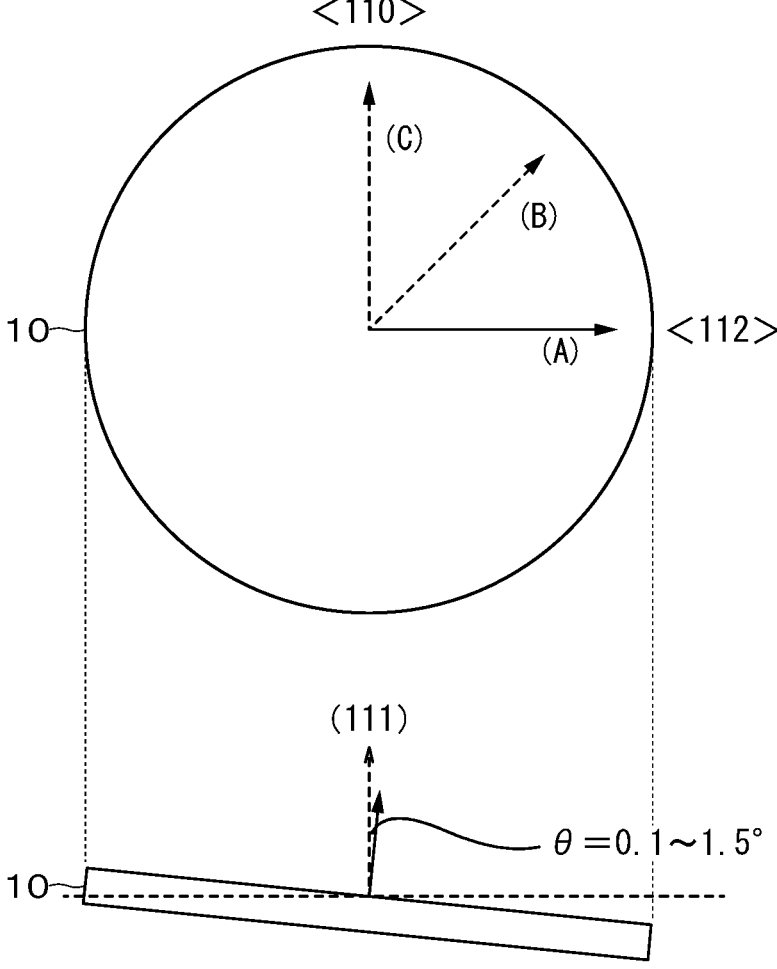
FIG. 12 is a view illustrating the structure of an Si substrate used in a method for manufacturing the group III nitride semiconductor substrate according to a ninth embodiment of the present invention.

FIG. 12 is a view illustrating the structure of an Si substrate used in a method for manufacturing the group III nitride semiconductor substrate according to a ninth embodiment of the present invention. The upper side of FIG. 12 is a plan view of the Si substrate, and the lower side illustrates a side view thereof.

As illustrated in FIG. 12, the method for manufacturing the group III nitride semiconductor substrate 1 according to the present embodiment is featured in that the Si substrate 10 to be used has its main surface inclined toward a <112> direction by 0.1° to 1.5° from the (111) plane of the silicon single crystal. The AlN buffer layer 20 and group III nitride semiconductor layer 30 can be grown on the Si substrate 10 by any of the methods according to the first to eighth embodiments.

The inclination angle of the main surface of the Si substrate 10 is preferably 0.1° to 1.5°. When the inclination angle from the (111) plane is smaller than 0.1°, the group III nitride semiconductor is grown in an island shape to cause an irregular undulation on the surface, and when the inclination angle is larger than 1.5°, the surface of the underlying AlN buffer layer becomes rough, with the result that the surface roughness of the group III nitride semiconductor layer 30 grown on the AlN buffer layer 20 is deteriorated. When the inclination angle falls within the range of 0.1° to 1.5°, minute steps exist on the surface of the Si substrate 10, and the group III nitride semiconductor layer 30 is grown following the minute steps, making it possible to reduce deterioration in the surface roughness.

The inclination direction of the main surface of the Si substrate 10 is preferably the <112> direction (see the arrow (A)). When the inclination direction is the <112> direction, an association state occurs at a (1100) plane in a hexagonal group III nitride semiconductor material, so that surface morphology becomes better than when the main surface is inclined in other directions to reduce the surface roughness.

As described above, in the method for manufacturing the group III nitride semiconductor substrate according to the present embodiment, the Si substrate 10 having a plane orientation slightly inclined from the (111) plane is used, so that the surface roughness of the upper surface of the group III nitride semiconductor layer 30 can be improved in a process of growing the group III nitride semiconductor layer 30 on the Si substrate 10 through the AlN buffer layer 20. Therefore, it is possible to suppress interface scattering of a device to be produced on the upper surface of the group III nitride semiconductor layer 30 and thereby to improve device characteristics.

While the preferred embodiments of the present invention have been described, the present invention is not limited to the above embodiments, and various modifications may be made within the scope of the present invention, and all such modifications are included in the present invention.

For example, the method for manufacturing the group III nitride semiconductor substrate according to the above first to ninth embodiments can be combined appropriately. Thus, as described above, the Si substrate 10 (seventh embodiment) containing an impurity element that suppresses an increase in the number of carriers due to the diffusion of the group III elements can be used in the semiconductor device manufacturing method according to the first to sixth embodiments. Further, the heat treatment in the eighth embodiment can be applied to the first to seventh embodiments, and the Si substrate 10 in the ninth embodiment can be used in the first to eighth embodiments.

EXAMPLES

Example 1

An Si substrate having a resistivity of 1000 Ωcm and a plane orientation of (111) was washed with HF and SC-1 and then set in the MOCVD furnace. Then, after the temperature inside the furnace was raised to 550° C., TMA and $NH_3$ were introduced into the furnace together with the $H_2$ carrier gas to grow a first AlN layer on the upper surface of the Si substrate to a thickness of 30 nm. Thereafter, the in-furnace temperature was raised to 1100° C. while the raw material was continuously fed to grow a second AlN layer on the first AlN layer to a thickness of 70 nm.

Then, the feeding of TMA was stopped, and the in-furnace temperature was lowered to 1050° C. while $NH_3$ was continuously fed. Thereafter, TMG (trimethylgallium) as a Ga source was fed to grow a GaN layer on the second AlN layer to a thickness of 1 um. In this manner, a group III nitride semiconductor substrate of Example 1 in which the first AlN layer, second AlN layer, and GaN layer were laminated in this order on the Si substrate was obtained.

Example 2

A group III nitride semiconductor substrate was produced under the same conditions as those in Example 1 except that TMA and $NH_3$ were alternately fed upon growth of the first AlN layer. The Si substrate was prepared in the same manner as in Example 1. Then, after the in-furnace temperature was stabilized at 550° C., a process of introducing TMA into the furnace for 3 seconds together with the $H_2$ carrier gas, introducing only the $H_2$ carrier gas for 3 seconds, introducing $NH_3$ for 3 seconds together with the $H_2$ carrier gas, and introducing only the $H_2$ carrier gas for 6 seconds was repeated to grow the first AlN layer to a thickness of 30 nm. Thereafter, the in-furnace temperature was raised to 1100° C., followed by introduction of TMA and $NH_3$ together with the $H_2$ carrier gas, to grow the second AlN layer to a thickness of 70 nm.

Then, the feeding of TMA was stopped, and the in-furnace temperature was lowered to 1050° C. while $NH_3$ was continuously fed. Thereafter, TMG as a Ga source was fed to grow the GaN layer on the second AlN layer to a thickness of 1 mm. In this manner, a group III nitride semiconductor substrate of Example 2 was obtained.

Example 3

A group III nitride semiconductor substrate was produced under the same conditions as in Example 1 except that TMA and $NH_3$ were alternately fed not only upon growth of the first AlN layer, but also upon growth of the second AlN layer. A process from the preparation of the Si substrate to growth of the first AlN layer is the same as in Example 2.

Then, after the in-furnace temperature was raised to 1100° C., a process of introducing TMA into the furnace for 3 seconds together with the $H_2$ carrier gas, introducing only the $H_2$ carrier gas for 3 seconds, introducing $NH_3$ for 3 seconds together with the $H_2$ carrier gas, and introducing only the $H_2$ carrier gas for 6 seconds was repeated to grow the second AlN layer to a thickness of 70 nm.

Thereafter, the GaN layer was grown to a thickness of 1 um in the same manner as in Example 1. Thus, a group III nitride semiconductor substrate of Example 3 was obtained.

Example 4

A group III nitride semiconductor substrate was produced under the same conditions as in Example 1 except that the GaN layer was grown at two temperature stages of low and high. The Si substrate was prepared in the same manner as in Example 1. Then, after the in-furnace temperature was raised to and stabilized at 650° C., TMA and $NH_3$ were introduced into the furnace together with the $H_2$ carrier gas to grow the first AlN layer to a thickness of 30 nm.

Thereafter, the in-furnace temperature was raised to 1100° C. to grow the second AlN layer to a thickness of 70 nm.

Then, after the in-furnace temperature was lowered to 750° C., TMG was introduced to grow a first GaN layer to a thickness of about 150 nm. Thereafter, the in-furnace temperature was raised to 1050° C. while TMG and $NH_3$ were continuously fed to grow a second GaN layer to a thickness of about 850 nm. That is, the second GaN layer continued to be grown until the total thickness of the first and second GaN layers becomes 1 um. In this manner, a group III nitride semiconductor substrate of Example 4 in which the first AlN layer, second AlN layer, first GaN layer, and second GaN layer were laminated in this order on the Si substrate was obtained.

Example 5

A group III nitride semiconductor substrate was produced under the same conditions as in Example 4 except that TMA was introduced together with TMG so as to grow an AlGaN layer in place of the first GaN layer of Example 4. That is, a group III nitride semiconductor substrate of Example 5 in which the first AlN layer, second AlN layer, AlGaN layer, and GaN layer were laminated in this order on the Si substrate was obtained.

Example 6

Upon growth of the first GaN layer of Example 5, TMG and $NH_3$ were alternately fed. After the in-furnace temperature was stabilized at 750° C., a process of introducing TMG for 3 seconds together with the $H_2$ carrier gas, introducing only the $H_2$ carrier gas for 3 seconds, introducing $NH_3$ for 3 seconds together with the $H_2$ carrier gas, and introducing only the $H_2$ carrier gas for 6 seconds was repeated to grow the first GaN layer to a thickness of 30 nm.

Thereafter, TMG and $NH_3$ were fed simultaneously, and the in-furnace temperature was raised to 1050° C. to grow the second GaN layer as in Example 4 to a thickness of 970 nm. Thus, a group III nitride semiconductor substrate of Example 6 was obtained.

Example 7

The AlN film was formed in the same manner as in Example 3, and the GaN film was formed in the same manner as in Example 6. That is, in the AlN film formation process, TMA and $NH_3$ were alternately fed not only upon growth of the first AlN layer, but also upon growth of the second AlN layer. Further, in the GaN film formation process, TMG and $NH_3$ were alternately fed upon growth of the first GaN layer, and they were simultaneously fed upon growth of the second GaN layer. In this manner, a group III nitride semiconductor substrate of Example 7 in which the first AlN layer, second AlN layer, first GaN layer, and second GaN layer were laminated in this order on the Si substrate was obtained.

Example 8

An Si substrate doped with C having a resistivity of 1000 Ωcm was prepared. The average concentration of C in the Si substrate was $1\times10^{16}$ atoms/$cm^3$. Thereafter, TMA and $NH_3$ were introduced into the furnace at 650° C. together with the $H_2$ carrier gas to grow the first AlN layer on the Si substrate to a thickness of 30 nm. Further, the second AlN layer was grown as in Example 1 to a thickness of 70 nm, and the GaN was grown to a thickness of 1 um. In this manner, a group III nitride semiconductor substrate of Example 8 was obtained.

Example 9

An Si substrate doped with Ge having a resistivity of 1000 Ωcm was prepared. The average concentration of Ge in the Si substrate was $1\times10^{18}$ atoms/$cm^3$. On the thus prepared Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 9 was obtained.

Example 10

An Si substrate doped with Sn having a resistivity of 1000 Ωcm was prepared. The average concentration of Sn in the Si substrate was $1\times10^{18}$ atoms/$cm^3$. On the thus prepared Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 10 was obtained.

Example 11

An Si substrate having a resistivity of 1000 Ωcm and containing O at a concentration of $1\times10^{17}$ atoms/$cm^3$ was prepared. On the thus prepared Si substrate, the first AlN layer of 30 nm thickness, second AlN layer of 70 nm thickness, and GaN layer of 1 um thickness were grown. Other conditions are the same as in Example 8. In this manner, a group III nitride semiconductor substrate of Example 11 was obtained.

Example 12

An Si film containing C at a concentration of $1\times10^{16}$ atoms/$cm^3$ was epitaxially grown to a thickness of 5 um on an Si substrate having a resistivity of 1000 Ωcm. As a result, an Si substrate containing C at a concentration of $1\times10^{16}$ atoms/$cm^3$ only in a surface layer part ranging from the surface to the depth of 5 um and at a concentration of $1\times10^{14}$ atoms/$cm^3$ in the substrate interior located deeper than the surface layer part was obtained. On the thus obtained Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 12 was obtained.

Example 13

An Si film containing Ge at a concentration of $1\times10^{18}$ atoms/cm$^3$ was epitaxially grown to a thickness of 5 um on an Si substrate having a resistivity of 1000 Ωcm. As a result, an Si substrate containing Ge at a concentration of $1\times10^{18}$ atoms/cm$^3$ only in a surface layer part ranging from the surface to the depth of 5 um and at a concentration of $1\times10^{14}$ atoms/cm$^3$ in the substrate interior located deeper than the surface layer part was obtained. On the thus obtained Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 13 was obtained.

Example 14

An Si film containing Sn at a concentration of $1\times10^{18}$ atoms/cm$^3$ was epitaxially grown to a thickness of 5 um on an Si substrate having a resistivity of 1000 Ωcm. As a result, an Si substrate containing Sn at a concentration of $1\times10^{18}$ atoms/cm$^3$ only in a surface layer part ranging from the surface to the depth of 5 um and at a concentration of $1\times10^{14}$ atoms/cm$^3$ in the substrate interior located deeper than the surface layer part was obtained. On the thus obtained Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 14 was obtained.

Example 15

O was ion-implanted into the surface of an Si substrate having a resistivity of 1000 Ωcm. As a result, an Si substrate containing O at a peak concentration of $1\times10^{17}$ atoms/cm$^3$ only in a surface layer part ranging from the surface to the depth of 5 um and at a concentration of $1\times10^{14}$ atoms/cm$^3$ in the substrate interior located deeper than the surface layer part was obtained. On the thus obtained Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 15 was obtained.

Example 16

An Si film containing P at a concentration of $1\times10^{18}$ atoms/cm$^3$ was epitaxially grown to a thickness of 5 um on an Si substrate. As a result, an Si substrate containing P at a concentration of $1\times10^{16}$ atoms/cm$^3$ only in a surface layer part ranging from the surface to the depth of 5 um and at a concentration of $1\times10^{14}$ atoms/cm$^3$ in the substrate interior located deeper than the surface layer part was obtained. On the thus obtained Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 16 was obtained.

Example 17

An Si film containing P at a concentration of $1\times10^{18}$ atoms/cm$^3$ was epitaxially grown to a thickness of 5 um on an Si substrate. As a result, an Si substrate was obtained, in which the concentration of P at the surface was $1\times10^{16}$ atoms/cm$^3$, which was gradually reduced to $1\times10^{14}$ atoms/cm$^3$ toward the depth of 5 um, and the concentration of P in the substrate interior deeper than 5 um was $1\times10^{14}$ atoms/cm$^3$. On the thus obtained Si substrate, the first AlN layer of 30 nm thickness, second AlN layer of 70 nm thickness, and GaN layer of 1 um thickness were grown. Other conditions are the same as in Example 8. In this manner, a group III nitride semiconductor substrate of Example 17 was obtained.

Example 18

H was ion-implanted on the surface of an Si substrate having a resistivity of 1000 Ωcm. As a result, an Si substrate containing H at a peak concentration of $1\times10^{17}$ atoms/cm$^3$ in a surface layer part ranging from the surface to the depth of 5 um and at a concentration of $1\times10^{14}$ atoms/cm$^3$ in the substrate interior located deeper than the surface layer part was obtained. On the thus obtained Si substrate, the first AlN layer of 30 nm thickness, the second AlN layer of 70 nm thickness, and the GaN layer of 1 um thickness were grown. Other conditions are the same as in Example 8. In this manner, a group III nitride semiconductor substrate of Example 18 was obtained.

Example 19

An Si substrate having a resistivity of 1000 Ωcm was washed with HF and SC-1 and then set in the MOCVD furnace. Then, after the in-furnace temperature was raised to and stabilized at 1100° C., TMA, NH$_3$ and PH$_3$ were introduced into the furnace together with the H$_2$ carrier gas to grow the first AlN layer doped with P to a thickness of 30 nm. The flow rate of PH$_3$ was determined so as to be able to cancel the carrier concentration of the Si substrate.

Then, the in-furnace temperature was lowered to 1050° C. The feeding of TMA was stopped during the temperature lowering, while NH$_3$ continued to be fed. Then, at a timing when the temperature was stabilized at 1050° C., TMG as a Ge source was fed to grow the GaN layer to a thickness of 1 um. In this manner, a group III nitride semiconductor substrate of Example 19 was obtained.

Example 20

A group III nitride semiconductor substrate of Example 20 was obtained under the same conditions as in Example 1 except that heat treatment of 1100° C. was performed for 30 minutes in the same furnace as for the growth of the ALN layer and GaN layer after the growth of the AlN layer to a thickness of 100 nm on the Si substrate and before growth of the GaN layer to a thickness of 1 um.

Comparative Example 1

An Si substrate having a resistivity of 1000 Ωcm and containing impurities such as C, Ge, Sn, O, and P at a concentration of $1\times10^{15}$ atoms/cm$^3$ or lower was prepared. The process until the baking is completed is the same as that in Example 1. Then, after the in-furnace temperature was stabilized at 650° C., TMA and NH$_3$ were introduced together with the H$_2$ carrier gas to grow the first AlN layer to a thickness of 30 nm. Thereafter, the in-furnace temperature was raised to 1100° C. with the raw material remaining unchanged to grow the second AlN layer. Further, after the in-furnace temperature was lowered to 1050° C. with the feeding of TMA being stopped, the GaN layer was grown to a thickness of 1 mm. In this manner, a group III nitride semiconductor substrate of Comparative Example 1 was obtained.

Comparative Example 2

A group III nitride semiconductor substrate of Comparative Example 2 was obtained under the same conditions as in Example 1 except that the growth temperature of the first AlN layer was changed to 350° C.

Comparative Example 3

A group III nitride semiconductor substrate of Comparative Example 3 was obtained under the same conditions as in Example 1 except that the growth temperature of the second AlN layer was changed to 800° C.

The crystallinity of the GaN layer, concentrations of Ga and Al on the surface of the Si substrate, and carrier concentration of the Si substrate were evaluated for the group III nitride semiconductor substrates of Examples 1 to 17 and Comparative Examples 1 to 3. The crystallinity of the GaN layer was relatively evaluated by a half-value width of the X-ray locking curve. A reference value for the relative evaluation was set to the value of Comparative Example 1. A lower half-value width indicates better crystallinity.

The concentrations of Ga and Al on the surface of the Si substrate were evaluated by SISM (Secondary Ion Mass Spectrometry). The carrier concentration of the Si substrate was evaluated by spreading resistance. The lower are the concentrations of Ga and Al, the better, but the point is that a carrier concentration that may affect device characteristics is low.

FIG. 13 is a table showing the evaluation results of the crystallinity of the GaN layer, impurity concentration on the surface of the Si substrate, and carrier concentration of the Si substrate in the group III nitride semiconductor substrates of Examples 1 to 20 and Comparative Examples 1 to 3. Values of each item are relative values based on the values of Comparative Example 1.

As illustrated in FIG. 13, as for the crystallinity of the GaN layer, Examples 1 to 19 and Comparative Example 1 exhibited favorable crystallinity of 1.2 or less. In particular, Example 2 exhibited better crystallinity than Example 1 due to alternate feeding of the raw material of the first AlN layer. Example 3 exhibited better crystallinity than Example 2 due to alternate feeding of not only the raw material of the first AlN layer, but also the raw material of the second AlN layer. Examples 4 to 19 exhibited better crystallinity than Example 2 by slightly increasing the growth temperature of the first AlN layer to 650° C.

On the other hand, Comparative Example 2 exhibited poor crystallinity of 100 due to a growth temperature as low as 350° C. of the first AlN layer. Comparative Example 3 exhibited slightly poor crystallinity of 30 due to a growth temperature as low as 800° C. of the second AlN layer.

As for the concentration of Ga, in Examples 1 to 7 and Comparative Example 2, diffusion of Ga was suppressed by growing the first AlN layer at a low temperature, whereby the Ga concentration in the Si substrate was as significantly low as 0.05 or less. Particularly, in Example 4, not only the first AlN layer, but also the first GaN layer was grown at a low temperature, with the result that the Ga concentration decreased to 0.02. Further, in Example 5, AlGaN was grown at a low temperature in place of GaN, with the result that the Ga concentration was further reduced to 0.01. In Example 6, the Ga concentration decreased to 0.01 due to alternate feeding of the raw material of the first GaN layer. In Example 7, the Ga concentration decreased to 0.01 due to alternate feeding of not only the raw material of the first AlN layer, but also the raw material of the second AlN layer.

On the other hand, in Examples 8 to 19 and Comparative Example 1, Ga was made to diffuse by slightly increasing the growth temperature of the first AlN layer to 650° C., with the result that the Ga concentration in the Si substrate was 1. In Example 20, Ga on the substrate surface was made to diffuse into the substrate interior by application of heat treatment after formation of the AlN layer, with the result the Ga concentration decreased to 0.05.

As for the concentration of Al, in Examples 1 to 7, diffusion of Al was suppressed by growing the first AlN layer at a low temperature, whereby the Al concentration in the Si substrate was as significantly low as 0.04 or less. Further, in Comparative Examples 2 and 3, diffusion of Al was suppressed due to a growth temperature as low as 350° C. of the first AlN layer (Comparative example 2) and a growth temperature as low as 800° C. of the second AlN layer (Comparative Example 3), with the result that the Al concentration in the Si substrate was as significantly low as 0.03 or less.

On the other hand, in Examples 8 to 19 and Comparative Example 1, Al was made to diffuse by slightly increasing the growth temperature of the first AlN layer to 650° C., with the result that the Al concentration in the Si substrate was 1. In Example 20, Ga on the substrate surface was made to diffuse into the substrate interior by application of heat treatment after formation of the AlN layer, with the result the Ga concentration decreased.

As for carrier concentration, in Examples 1 to 7, diffusion of Ga was suppressed by growing the first AlN layer at a low temperature, whereby the carrier concentration was as low as 0.05 or less. Further, in Examples 8 to 18, an increase in the number of carriers in the Si substrate due to diffusion of Ga was suppressed by inclusion of an impurity such as C in the Si substrate. In Example of 19, an increase in the number of carriers in the Si substrate due to diffusion of Ga was suppressed by inclusion of an n-type impurity such as P not in the Si substrate but in the first AlN layer. Among the above results, the carrier concentration in Examples 17 and 19 was the lowest at 0.01 which was almost equal to the carrier concentration in a normal Si substrate.

On the other hand, in Comparative Example 1, the growth temperature of the first AlN layer was high, and Ga was made to diffuse into the Si substrate by growing the first AlN layer at a high temperature, whereby the carrier concentration was 1. In the Comparative Example 2, the carrier concentration could be suppressed to a low level as in Examples 1 to 7, while in Comparative Example 3, the carrier concentration was increased. In Example 20, Ga on the substrate surface was made to diffuse into the substrate interior by application of heat treatment after formation of the AlN layer, with the result the Ga concentration decreased.

Example 21

In order to discuss influence of the plane orientation of the Si substrate, an Si substrate having its main surface inclined toward a <112> direction (see arrow (A) in FIG. 12) by 0.2° from the (111) plane was prepared. Then, the Si substrate was washed with HF and SC-1 and then set in the MOCVD furnace. Then, after the in-furnace temperature was raised to 1100° C., TMA and NH$_3$ were introduced into the furnace together with the H$_2$ carrier gas to grow the AlN layer on the upper surface of the Si substrate to a thickness of 100 nm. Thereafter, feeding of TMA was stopped, and the in-furnace temperature was lowered to 1050° C. while NH$_3$ continued to be fed. Then, TMG as a Ge source was fed to grow the GaN layer to a thickness of 1 um on the AlN layer. In this manner, a group III nitride semiconductor substrate of Example 21 in which the AlN layer and GaN layer were laminated in this order on the Si substrate was obtained.

Example 22

Example 22 was the same as Example 21 except that the inclination angle (off-angle) of the main surface of the Si substrate from the (111) plane was set to 1.5° toward the <112> direction.

Comparative Example 4

Comparative Example 4 was the same as Example 21 except that the inclination angle of the main surface of the Si substrate from the (111) plane was set to 0°, that is, the Si substrate has a (111) plane orientation.

Comparative Example 5

Comparative Example 5 was the same as Example 21 except that the inclination angle of the main surface of the Si substrate from the (111) plane was set to 2° toward the <112> direction.

Comparative Example 6

Comparative Example 6 was the same as Example 21 except that the inclination angle of the main surface of the Si substrate from the (111) plane was set to 0.2° toward a direction of 45° (see arrow (B) in FIG. 12) from the <112> direction.

Comparative Example 7

Comparative Example 7 was the same as Example 21 except that the inclination angle of the main surface of the Si substrate from the (111) plane was set to 0.2° toward the <110> direction (see the arrow (C) in FIG. 12).

The surfaces of the group III nitride semiconductor layers of Examples 21, 22, and Comparative Examples 4 to 7 produced by the above processes were observed using an atomic force microscope and evaluated in terms of surface roughness. The range of evaluating the surface roughness was set to a square of 30 um×30 um and a square of 10 um×10 um. The results are illustrated in FIG. 14.

As illustrated in FIG. 14, the surface roughness in the wide range of 30 um×30 um was 1.2 nm or less in Examples 21 and 22, while it was 1.6 nm or more in Comparative Examples 4 to 7. Although when the surface roughness in the range of 30 um×30 um exceeds 1.3 nm, it may affect a device, good results less than 1.3 nm were obtained in Examples 21 and 22. On the other hand, the surface roughness in the narrow range of 10 um×10 um was 0.6 nm or less in Examples 21 and 22, and Comparative Example 4, while it was 1.0 nm or more in Comparative Examples 5 to 7. Although when the surface roughness in the range of 10 um×10 um exceeds 0.8 nm, it may affect a device, good results less than 0.8 nm were obtained in Examples 21 and 22.

REFERENCE SIGNS LIST

1, 2, 3: Group III nitride semiconductor substrate
10: Si substrate
10a: Surface layer part of Si substrate
20: AlN buffer layer
21: First AlN buffer layer
22: Second AlN buffer layer
30: Group III nitride semiconductor layer
31: First group III nitride semiconductor layer
32: Second group III nitride semiconductor layer

The invention claimed is:

1. A method for manufacturing a group III nitride semiconductor substrate, the method comprising:

growing a first AlN buffer layer on a Si substrate at a first growth temperature;

growing a second AlN buffer layer on the first AlN buffer layer at a second growth temperature higher than the first growth temperature; and growing a group III nitride semiconductor layer on the second AlN buffer layer, wherein:

an Al raw material and a N raw material are alternately repeatedly fed in the growing the first AlN buffer layer, the first growth temperature is 400° C. to 800° C., and the second growth temperature is 900° C. to 1200° C., a resistivity of the Si substrate is 100 Ωcm or more, the Si substrate contains an impurity element selected from C, Ge, Sn, O, H, and a group V element, a concentration of the impurity element contained in a surface layer part of the Si substrate ranging from the surface to the depth of 0.5 um to 10 um is $1\times10^{12}$ atoms/cm$^3$ to $1\times10^{20}$ atoms/cm$^3$, and a concentration of impurity element contained in an area at a depth of greater than 10 μm from the surface is lower than the concentration in the surface layer part.

2. The method for manufacturing a group III nitride semiconductor substrate as claimed in claim 1, wherein the first growth temperature is 400° C. to 600° C.

3. The method for manufacturing a group III nitride semiconductor substrate as claimed in claim 1, wherein the Al raw material is introduced prior to the introduction of the N raw material in the growing the first AlN buffer layer.

4. The method for manufacturing a group III nitride semiconductor substrate as claimed in claim 1, wherein the thickness of the first AlN buffer layer is 0.4 nm to 100 nm.

5. The method for manufacturing a group III nitride semiconductor substrate as claimed in claim 1, wherein a total thickness of the first and second AlN buffer layers is 30 nm to 200 nm.

6. The method for manufacturing a group III nitride semiconductor substrate as claimed in claim 1, wherein the Al raw material and the N raw material are each fed for 0.5 second to 10 seconds in the growing the first AlN buffer layer.

7. The method for manufacturing a group III nitride semiconductor substrate as claimed in claim 1, wherein the Al raw material and the N raw material are alternately repeatedly fed in the growing the second AlN buffer layer.

8. The method for manufacturing a group III nitride semiconductor substrate as claimed in claim 1 further comprising applying heat treatment at 900° C. to 1450° C. to the Si substrate on which the first AlN buffer layer and second AlN buffer layer have been sequentially grown before growing the group III nitride semiconductor layer.

9. The method for manufacturing a group III nitride semiconductor substrate as claimed in claim 1, wherein the Si substrate has a main surface inclined toward a <112> direction by 0.1° to 1.5° from the (111) plane of a silicon single crystal.

10. The method for manufacturing a group III nitride semiconductor substrate as claimed in claim 1, wherein growing the group III nitride semiconductor layer includes:

growing a first group III nitride semiconductor layer on the second AlN buffer layer at a third growth temperature; and growing a second group III nitride semiconductor layer on the first group III nitride semiconductor layer at a fourth growth temperature higher than the third growth temperature.

11. The method for manufacturing a group III nitride semiconductor method as claimed in claim 10, wherein the third growth temperature is 400° C. to 800° C., and the fourth growth temperature is 900° C. to 1200° C.

12. The method for manufacturing a group III nitride semiconductor substrate as claimed in claim 10, wherein the thickness of the first group III nitride semiconductor layer is 10 nm to 200 nm.

13. The method for manufacturing a group III nitride semiconductor substrate as claimed in claim 10, wherein a group III raw material and the N raw material are alternately repeatedly fed in the growing the first group III nitride semiconductor layer.

14. The method for manufacturing a group III nitride semiconductor substrate as claimed in claim 10, wherein:

the first group III nitride semiconductor layer is made of AlGaN, and the second group III nitride semiconductor layer is made of GaN.

15. The method for manufacturing a group III nitride semiconductor substrate as claimed in claim 1, wherein the concentration of the impurity element contained in the entire Si substrate including the surface layer part is $1\times10^{12}$ atoms/cm$^3$ to $1\times10^{20}$ atoms/cm$^3$.

16. The method for manufacturing a group III nitride semiconductor substrate as claimed in claim 1, wherein the impurity element is C, and the concentration of the impurity element contained in the surface layer part is $1\times10^{14}$ atoms/cm$^3$ to $1\times10^{17}$ atoms/cm$^3$.

17. The method for manufacturing a group III nitride semiconductor substrate as claimed in claim 1, wherein the impurity element is Ge or Sn, and the concentration of the impurity element contained in the surface layer part is $1\times10^{14}$ atoms/cm$^3$ to $1\times10^{20}$ atoms/cm$^3$.

18. The method for manufacturing a group III nitride semiconductor substrate as claimed in claim 1, wherein the impurity element is O, and the concentration of the impurity element contained in the surface layer part is $1\times10^{15}$ atoms/cm$^3$ to $5\times10^{18}$ atoms/cm$^3$.

19. The method for manufacturing a group III nitride semiconductor substrate as claimed in claim 1, wherein the impurity element is H, and the concentration of the impurity element contained in the surface layer part is $1\times10^{15}$ atoms/cm$^3$ to $5\times10^{18}$ atoms/cm$^3$.

20. The method for manufacturing a group III nitride semiconductor substrate as claimed in claim 1, wherein the impurity element contains at least one group V element selected from N, P, As, and Sb, the concentration of the impurity element contained in the surface layer part is $1\times10^{12}$ atoms/cm$^3$ to $1\times10^{19}$ atoms/cm$^3$, and the concentration of the impurity element contained in a deeper area than the surface layer part is $1\times10^{14}$ atoms/cm$^3$ or less.

21. The method for manufacturing a group III nitride semiconductor substrate as claimed in claim 20, wherein the impurity element in the Si substrate has a concentration gradient in which the concentration thereof is reduced toward the substrate interior from the surface.

22. The method for manufacturing a group III nitride semiconductor substrate as claimed in claim 1, wherein a raw material containing a group V element (P, As, Sb) other than N is fed together with the Al raw material or N raw material in the growing the first AlN buffer layer.

* * * * *